United States Patent [19]

Okano et al.

[11] Patent Number: 5,774,863
[45] Date of Patent: Jun. 30, 1998

[54] SPEECH INFORMATION RECORDING/REPRODUCING APPARATUS

[75] Inventors: Hideo Okano, Han-no; Hisashi Suekane, Hachioji; Hisato Torii, Hachioji; Takafumi Onishi, Hachioji; Nobuo Terui, Hachioji; Hidetaka Takahashi, Hachioji; Hiroshi Takisawa, Hoya, all of Japan

[73] Assignee: Olympus Optical Co., Ltd., Tokyo, Japan

[21] Appl. No.: 415,341

[22] Filed: Apr. 3, 1995

[30] Foreign Application Priority Data

Oct. 13, 1994 [JP] Japan .................................. 6-248100

[51] Int. Cl.⁶ .................................................. G10L 3/00
[52] U.S. Cl. ......................................... 704/278; 704/270
[58] Field of Search ........................... 395/2.79–81, 2.87, 395/2.67, 2.71–74, 2.76; 704/270–272, 278, 258, 262–265, 267, 201

[56] References Cited

U.S. PATENT DOCUMENTS

| 4,849,832 | 7/1989 | Yamagata et al. ........................ 360/66 |
| 5,481,645 | 1/1996 | Bertino et al. ......................... 395/2.79 |

FOREIGN PATENT DOCUMENTS

| 004207447 | 9/1993 | Germany .............................. 395/2.81 |

OTHER PUBLICATIONS

Arons, "SpeechSkimmer: Interactively Skimming Recorded Speech," Proceedings of UIST '93: ACM Symposium on User Interface Software and Technology, ACM Press, Atlanta, pp. 187–196, Nov. 1993.

Stifelman et al., "VoiceNotes: A Speech Interface for a Hand–Held Voice Notetaker," Human Factors on Computing Systems Interchi '93, 179–86, Apr. 1993.

*Primary Examiner*—David D. Knepper
*Attorney, Agent, or Firm*—Frishauf, Holtz, Goodman, Langer & Chick

[57] ABSTRACT

A speech information recording/reproduction apparatus includes a CPU for recording digital speech data, into which a speech signal is converted, in a rewritable solid memory, a partial erasing switch for erasing the speech data recorded in the solid memory, and a reproduction switch for setting an erasing range of the speech data from the solid memory. The CPU delays execution of erasure for several seconds after the erasing range is set, and predetermined information about the execution of erasure is displayed by an LCD and an LED for these several seconds. The CPU does not erase the speech data from the solid memory when a reset switch is operated to cancel the execution of erasure during the display of the information, but erases it after the information is displayed when the reset switch is not operated during the display.

23 Claims, 19 Drawing Sheets

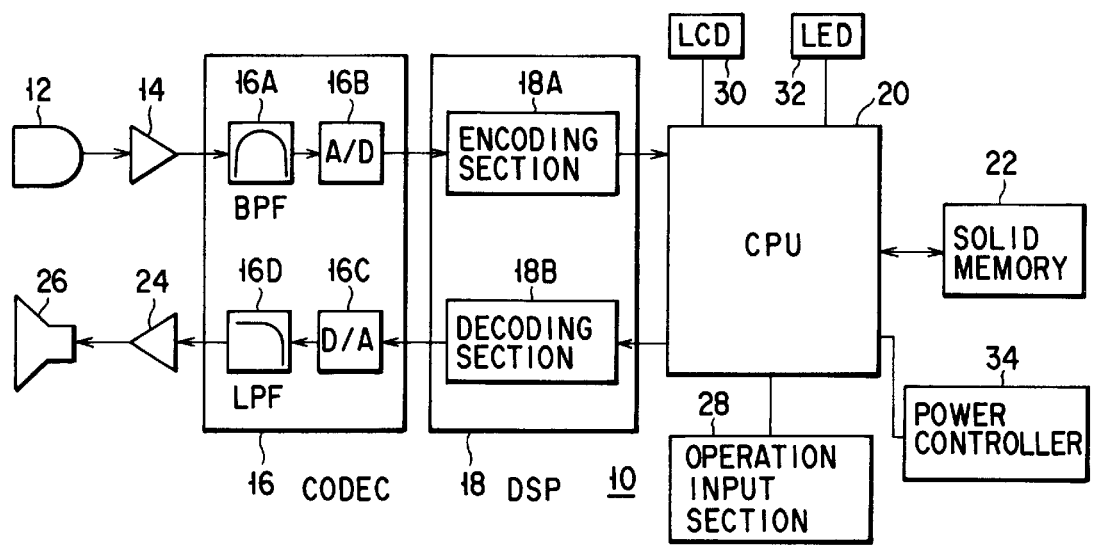
F I G. 1
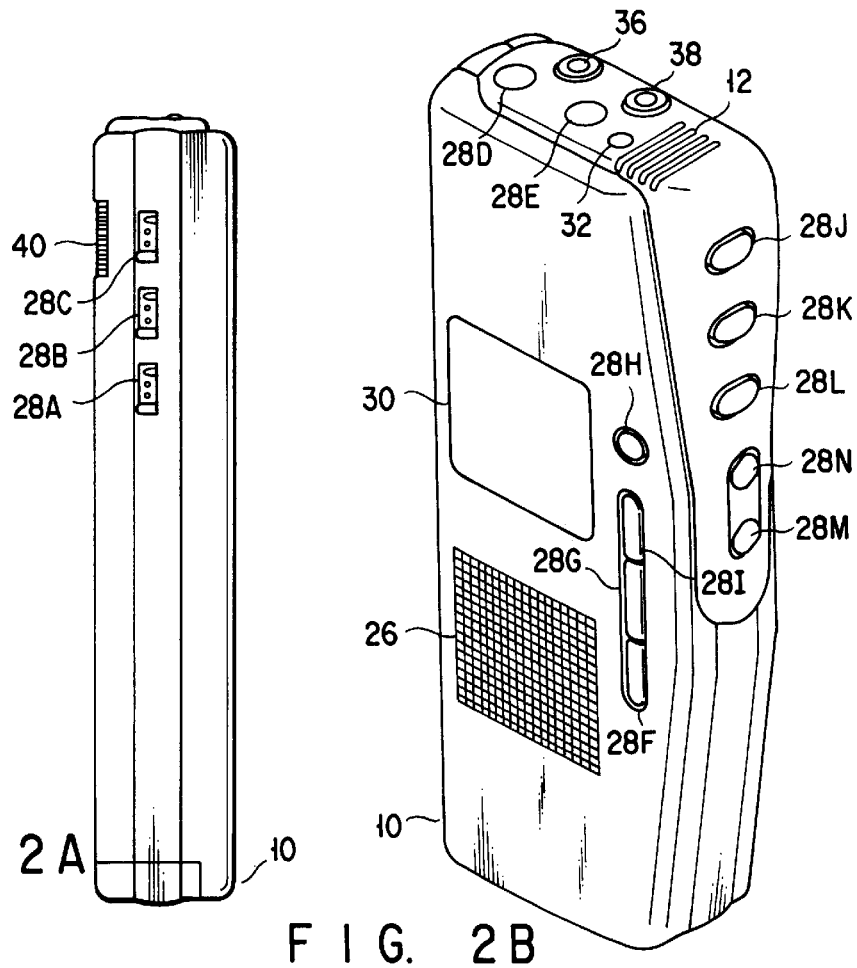
F I G. 2A
F I G. 2B

FIG. 4A  
FIG. 4B  
FIG. 4C  
FIG. 4D  
FIG. 4E  
FIG. 4F  
FIG. 4G  
FIG. 4H  
FIG. 4I  
FIG. 4J

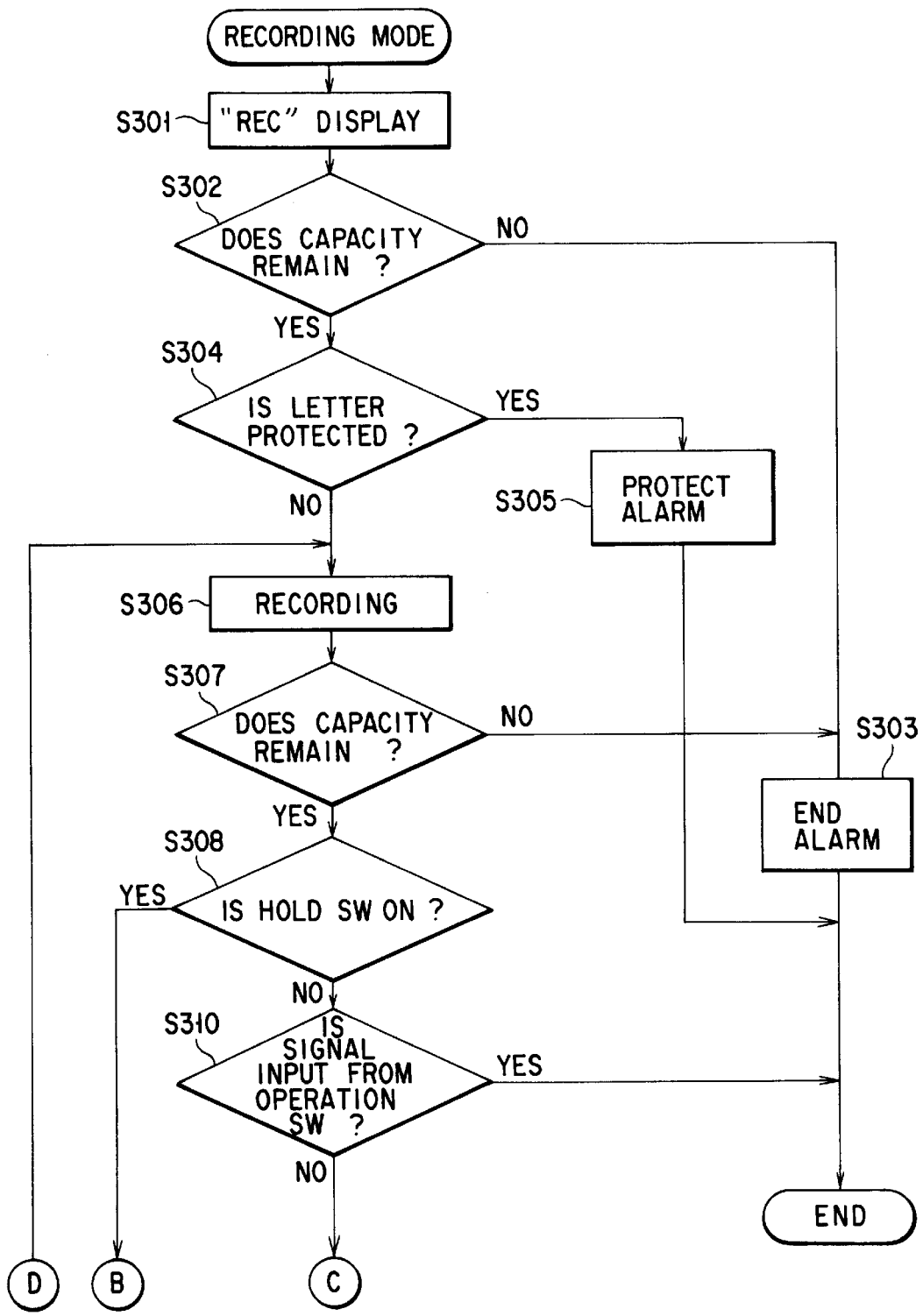
F I G. 7A

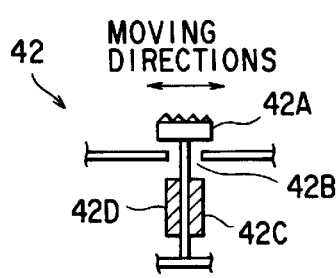
F I G. 11A
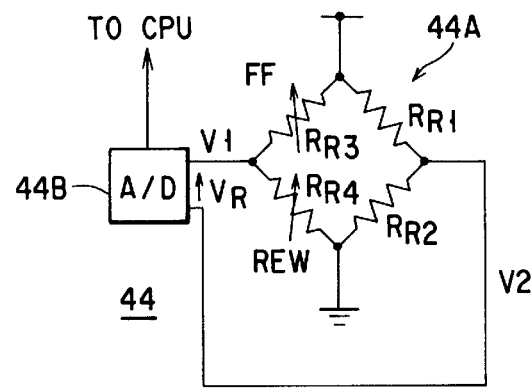
F I G. 11B  $V_R = V2 - V1$
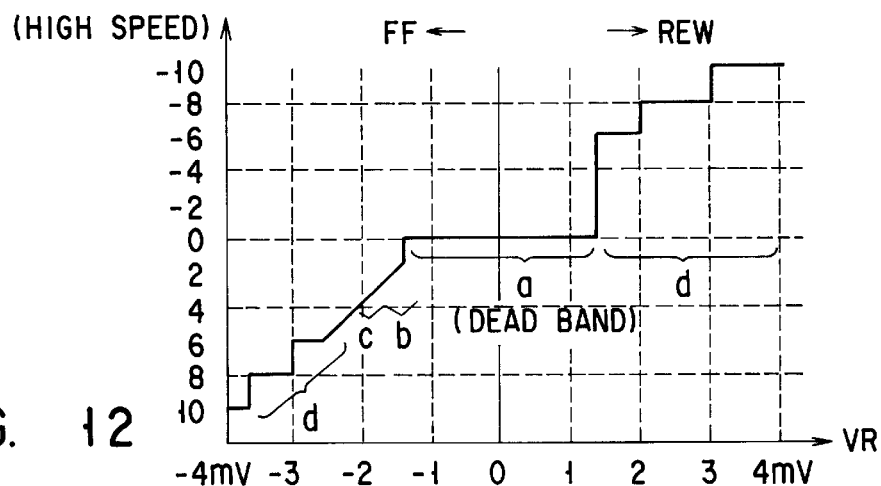
F I G. 12
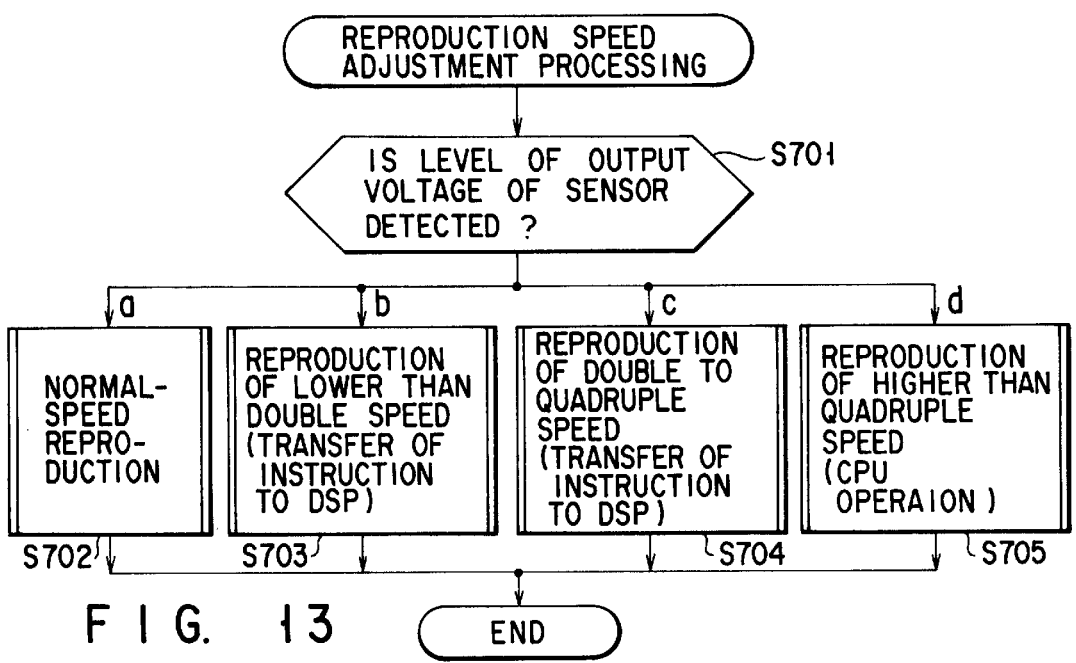
F I G. 13

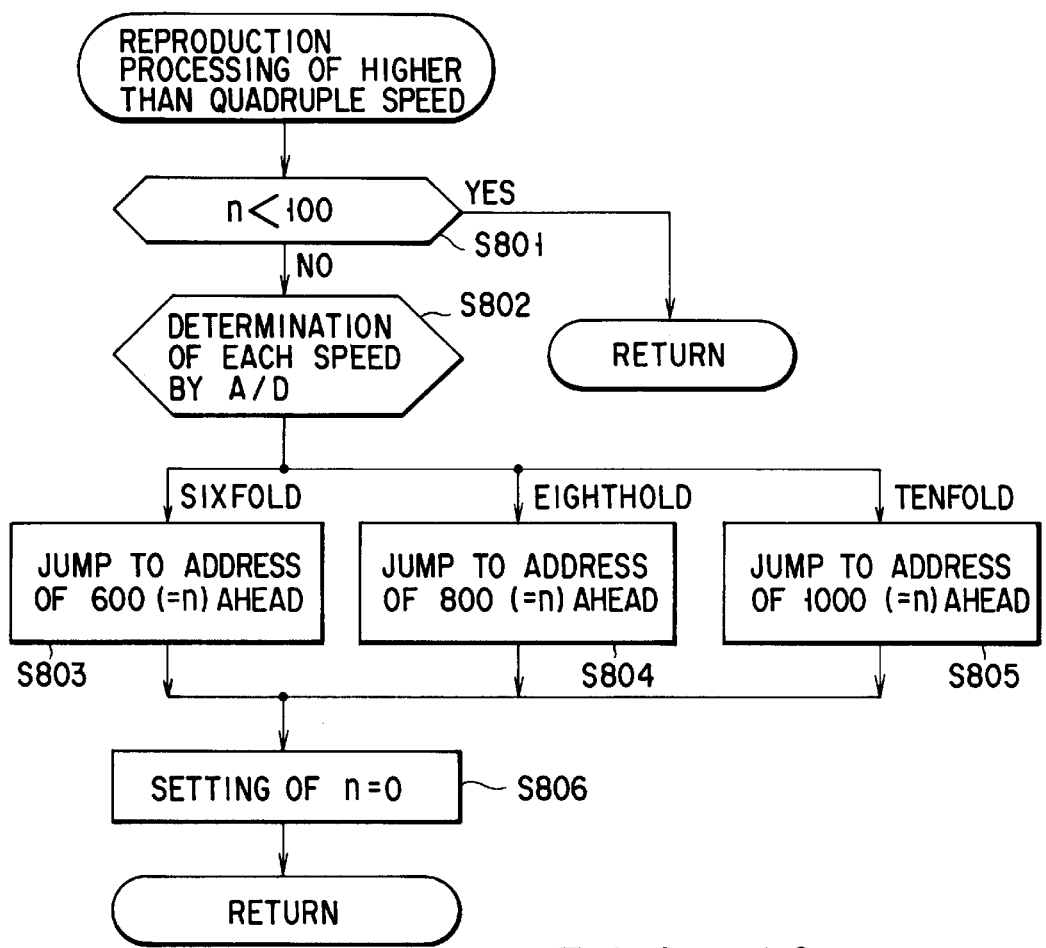
F I G. 16
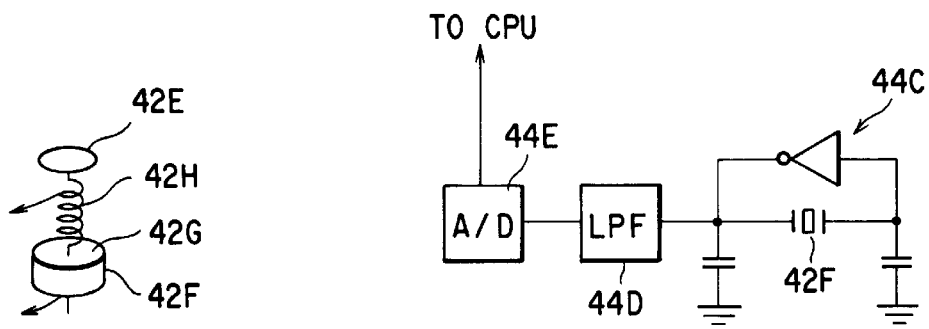
F I G. 17A
F I G. 17B

SPEECH INFORMATION RECORDING/REPRODUCING APPARATUS

BACKGROUND OF THE INVENTION

1. Field of the Invention

The present invention relates to a speech information recording/reproduction apparatus for converting a speech signal into digital data and recording/reproducing the digital data on/from a rewritable solid memory.

2. Description of the Related Art

At present, an apparatus for recording/reproducing a speech signal on/from a magnetic tape is widely used as one speech information recording/reproduction apparatus. In this apparatus, a recorded content can be erased by only erasing itself without recording another content or by recording a silent signal thereon. In either case, a mechanical operation is required for erasing the recorded content and thus a range of erasing cannot be set accurately. Furthermore, the tape has to be run to actually perform the erasing operation, thus requiring extra time. Since an erased part of contents remains blank on a tape, it sounds unnatural to a listener when the contents are reproduced. To avoid these problems, usually, recording is performed again without erasure.

In a so-called dictation transcribe system, an operator transcribes the contents recorded on a tape by an unspecified recorder and returns it to the recorder. Since, however, the same tape is not always returned to the original recorder, the contents of the tape have to be erased. The dictation transcribe system therefore has a high-speed erasing function of rewinding the tape while erasing the contents thereof.

A digital recorder for converting a speech signal into digital data and recording/reproducing it on/from a rewritable solid memory is put to practical use in place of the above-described apparatus for recording/reproducing speech information on/from a magnetic tape.

In the digital recorder, since recorded data can be managed as digital data, arbitrary part of the data is erased and the remaining data items can be connected. Since the recorded data can be erased instantaneously, the erasing function, which was not useful so far, has been lately considered to be important.

However, in the digital recorder described above, since the recorded data is erased instantaneously by an erasing operation, an error in operation may occur. In an apparatus for recording data on a magnetic tape, even if an operator performs an erasing operation by mistake, he or she is able to cancel the operation immediately, with the result that the greater part of the contents recorded on the tape can be maintained. In the digital recorder, however, since all the contents are erased at once, they cannot be recovered.

To overcome the problem of the digital recorder, a function of allowing an operator to confirm whether he or she wishes to erase data recorded on a memory, can be added to the digital recorder, as in a computer system and the like. It is however difficult to have such a function in restricted display and operation sections of a miniaturized system such as a speech information recording/reproduction apparatus.

SUMMARY OF THE INVENTION

An object of the present invention is to provide a speech information recording/reproduction apparatus which makes it difficult for an operator to perform an erroneous operation and enables a control operation in accordance with an operator's operation.

Another object of the present invention is to provide a speech information recording/reproduction apparatus which prevents an operator from erasing recorded data by mistake.

Still another object of the present invention is to provide a speech information recording/reproduction apparatus capable of providing an operator with necessary information in a restricted display area.

According to the present invention, there is provided a speech information recording/reproduction apparatus comprising:

speech data recording means for recording digital speech data, into which a speech signal is converted, in a rewritable solid memory;

erasing means for erasing the speech data from the solid memory;

first operation means for setting erase range to erase the speech data from the solid memory;

delay means for delaying erasing the speech data by a predetermined period of time after the erase range is set by the first operation means;

display means for displaying predetermined information on erasure for the predetermined period of time;

second operation means for canceling the erasure; and control means for preventing the erasing means from erasing the speech data when the second operation means is operated while the display means is displaying the predetermined information and for causing the erasing means to erase the speech data from the solid memory when the second operation means is not operated while the display means is displaying the predetermined information.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing a constitution of a solid memory recording/reproduction apparatus according to a first embodiment of a speech information recording/reproduction apparatus of the present invention;

FIGS. 2A and 2B are side and perspective views showing the appearance of the solid memory recording/reproduction apparatus shown in FIG. 1;

FIGS. 4A to 4S are segment views of liquid crystal display, in which FIG. 4A shows power-off; FIG. 4B shows power-on in an overwrite mode; FIG. 4C shows power-on in an insert recording mode; FIG. 4D shows reproducing; FIG. 4E shows fast-reproducing; FIG. 4F shows recording; FIG. 4G shows fast-forward addressing; FIG. 4H shows fast-backward addressing; FIG. 4I shows recording of end of letter mark; FIG. 4J shows recording of instruction mark; FIG. 4O shows a battery capacity when power is on; FIG. 4S shows no memory capacity during the recording;

FIGS. 7A and 7B are a flowchart of a recording mode processing shown in FIG. 6A;

FIGS. 11A and 11B are views showing a stepless operation member and a detection circuit thereof used in a solid memory recording/reproduction apparatus according to a second embodiment of the speech information recording/reproduction apparatus of the present invention;

FIG. 12 is a view showing a relationship between an output voltage of a pressure sensor and a reproduction speed;

FIG. 13 is a flowchart for explaining in detail a processing for adjusting a reproduction speed;

FIG. 16 is a flowchart showing the reproduction at a speed higher than 4 times the normal speed, as shown in the flowchart of FIG. 13;

FIGS. 17A and 17B are views showing another stepless operation member and a detection circuit thereof;

DETAILED DESCRIPTION OF THE PREFERRED EMBODIMENTS

Figure 3:
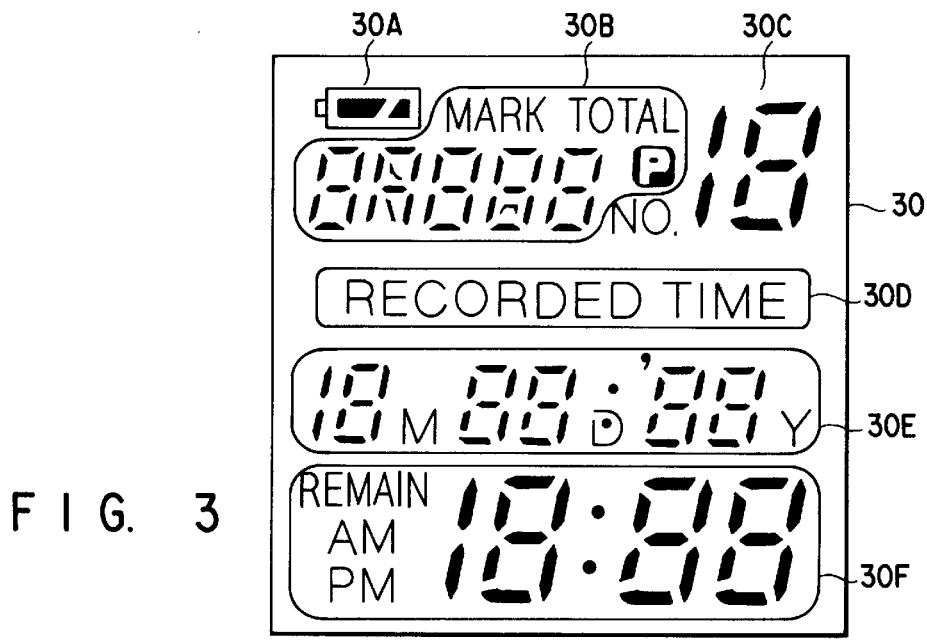
FIG. 3 is a segment view of a liquid crystal display area of the apparatus shown in FIG. 1.

FIG. 1 is a block diagram showing a constitution of a solid memory recording/reproduction apparatus (hereinafter referred to as a digital recorder) according to a first embodiment of a speech information recording/reproduction apparatus of the present invention.

When a speech is recorded, a speech signal input from a built-in microphone 12 is amplified by an input amplifier 14 and transmitted to a coder/decoder (CODEC) 16. In the CODEC 16, the signal is supplied to an analog-to-digital (A/D) converter 16B via a band-pass filter (BPF) 16A, and converted into digital data therein. The digital data is sent to a digital signal processor (DSP) 18, and compressed for each frame in an encoding section 18A of the DSP 18. The compressed data is transmitted to a central processing unit (CPU) 20 in unit of frame and stored in a solid memory 22 along with various types of additional information under control of the CPU 20. For example, 16-Mbit data can be recorded on the solid memory 22.

When a speech is reproduced, speech data recorded on the solid memory 22 is read out for each frame by the CPU 20, transmitted to the DSP 18, and decoded by a decoding section 18B of the DSP 18. The decoded data is then converted into a speech signal by a digital-to-analog (D/A) converter 16C arranged in the CODEC 16. The speech signal is output from the CODEC 16 through a low-pass filter (LPF) 16D, and amplified by an output amplifier 24 and output as a speech from a built-in speaker 26.

The CPU 20 manages speech data recorded on the solid memory 22 in unit of letter which is, for example, a series of sentences constituting one letter, and controls the memory in recording, reproducing and erasing operations. In digital recorder 10 of the first embodiment, the files of the recorded speech data are managed in unit of letter, and 19 letters (files) can be recorded at the maximum. The CPU 20 also executes various modes of the digital recorder 10 in response to an operation signal input from an operation input section 28 including a plurality of switches, and displays the current mode, using a liquid crystal display (LCD) 30 and a red-colored light emitting diode (LED) 32.

Furthermore, the CPU 20 controls a power controller 34 in accordance with an input from a power switch of the operation input section 28. More specifically, when the power switch turns off, power is stopped from being supplied to the respective components, and the mode is switched to a low-consumption current mode, with the result that only the clock function of the CPU 20 is fulfilled to display time on the LCD 30.

FIGS. 2A and 2B are views of the appearance of the digital recorder 10 shown in FIG. 1.

The digital recorder 10 includes the operation switches constituting the operation input section 28, the LCD 30 and LED 32 constituting the display area, and the like. The operation input section 28 includes eleven push switches and three slide switches to set the modes of the recorder 10 and perform various operations.

FIG. 3 is a view of segments of liquid crystal displayed on the LCD 30. The LCD displays the modes and various items of information of the digital recorder 10. FIGS. 4A to 4S are views of various examples of liquid crystal display.

Figure 4N:
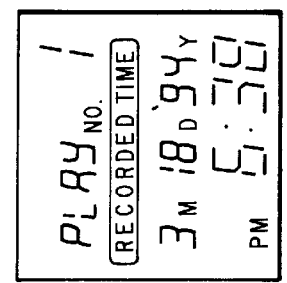
FIG. 4N shows the recording date and time of a letter when the head of the letter is reproduced.
Figure 4M:
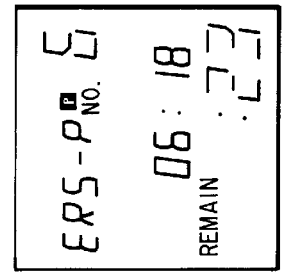
FIG. 4M shows setting of protect from erroneous erasure and protect alarm.
Figure 4L:
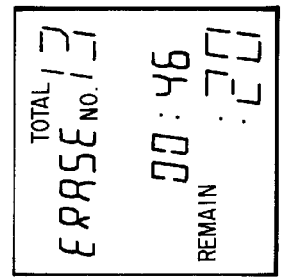
FIG. 4L shows reservation of whole letter erasure.
Figure 4K:
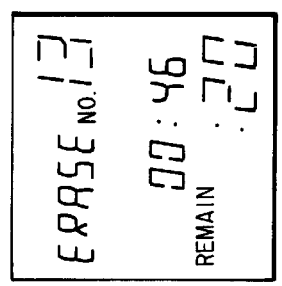
FIG. 4K shows setting of partial erasure and reservation of partial erasure and letter erasure.
Figure 4S:
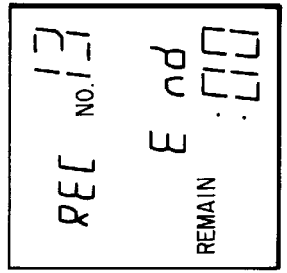
Figure 4R:
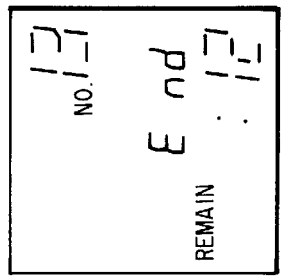
FIG. 4R shows memory end due to reproduction and fast-forward addressing.
Figure 4Q:
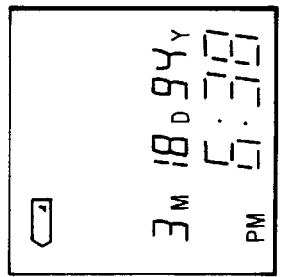
FIG. 4Q shows stopping of operation due to low battery voltage.
Figure 4P:
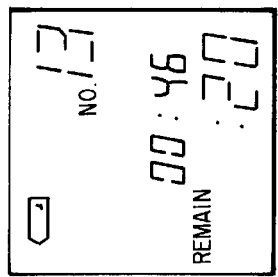
FIG. 4P shows a warning of low battery voltage.
Figure 4O:
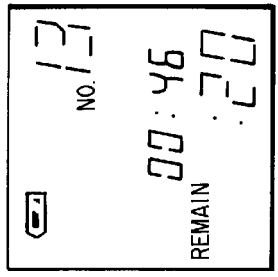

FIGS. 4A to 4S are segment views of liquid crystal display. FIG. 4A shows power-off; FIG. 4B shows power-on in an overwrite mode; FIG. 4C shows power-on in an insert recording mode; FIG. 4D shows reproducing; FIG. 4E shows fast-reproduction; FIG. 4F shows recording; FIG. 4G shows fast-forward addressing (FF); FIG. 4H shows fast-backward addressing (REW); FIG. 4I shows recording of end of letter mark (E mark); FIG. 4J shows recording of instruction mark (I mark); FIG. 4K shows setting of partial erasure and reservation of partial erasure and letter erasure; FIG. 4L shows reservation of whole letter erasure; FIG. 4M shows setting of protect from erroneous erasure and protect alarm; FIG. 4N shows the recording date and time of a letter when the head of the letter is reproduced; FIG. 4O shows a battery capacity when power is on; FIG. 4P shows a warning of low battery voltage; FIG. 4Q shows stopping of operation due to low battery voltage; FIG. 4R shows memory end due to reproduction and FF; and FIG. 4S shows no memory capacity during the recording.

In the LCD 30 shown in FIG. 3, segment section 30A indicates the remaining battery capacity and is lit for several seconds when the power switch turns on if the battery capacity exceeds a predetermined level (FIG. 4O). If the capacity decreases below the predetermined level, only the outside segments are blinking for several seconds (FIG. 4P). When the remaining battery capacity is small, the outside segments are lit for several seconds, and the current mode is stopped, the power is cut off, and the present time is displayed (FIG. 4Q).

Segment section 30B indicates an operation mode of the digital recorder 10 and various states set therein, and segment section 30C does the current letter number. Segment section 30D is lit to display the recording date and time. When the head of a letter is reproduced, the segment section 30D indicates the date and time when the first recording starts or ends or when the final recording starts or ends (FIG. 4N).

Segment section 30E indicates the present date when the power switch turns off and does the recording time starting from the head of a letter in seconds when the switch turns on. Segment section 30F shows the current time when the power switch turns off and does the remaining recordable time in minutes when the switch turns on.

In FIG. 2B, the LED 32 turns on during the erasing operation and blinks in association with various alarms (described later). The LED also blinks in a recording standby state where an input speech signal is decreased in level during the recording in a speech starting mode. One channel of a stereo jack 36 serves as an output terminal of an earphone and the other channel serves as an input terminal of a foot switch remote-controller. One channel of another stereo jack 38 is used as an input terminal of a microphone and the other channel is used as that of a hand remote-controller. A volume 40 is used to adjust the volume of the recorder during the reproduction and to adjust a starting level during the recording in the speech starting mode.

The functions of the operation switches shown in FIGS. 2A and 2B and the contents displayed on the LCD 30 by operation of the switch, will be described hereinafter.

A slide switch 28A serves as a power switch. When the power switch turns on, the digital recorder displays recording on the liquid display and receives signals from the operation switches (FIG. 4B). When the power switch turns off, the recorder changes the display of recording to that of clock information (FIG. 4A) and receives no signals from the operation switches. The slide switch 28A also serves as a hold switch. More specifically, when the switch 28A is turned on in the recording, reproduction, FF, or REW mode, i.e., when the power supply is turned off, the mode is continued to inhibit a signal of the operation switch from being input. When the hold switch is turned on in the recording, reproduction, FF, or REW mode, the digital recorder does not receive any signals from the operation switches until the mode is finished at the memory end. If the mode is stopped at the memory end, the power supply is turned off immediately. To stop a mode after the hold switch is turned on, an operation has to be performed after the hold switch is turned off, which is effective in preventing an error in operation from being caused in the current mode.

A slide switch 28B is a sound quality selection switch for selecting recording time by varying a bit rate at which a speech signal is converted into digital data. A slide switch 28C serves both to select a speech starting mode and to select a fast reproduction mode. When the switch 28C is turned on, a speech starting function is carried out during the recording, and recording is performed only when the level of an input speech signal is higher than a predetermined one, and reproduction is then performed at a 1.5-fold speed.

When an E mark switch 28D is depressed during the recording or stopping of the recorder, an E mark is displayed on the LCD 30 for several seconds (FIG. 4I), and letter is updated. For example, if the switch 28D is depressed during or after the recording of letter No. 18, the recording of letter No. 19 is started. If the recording of letter No. 19 has been finished, an alarm is raised, and both the E mark and letter number are displayed blinkingly for several seconds, thus inhibiting the letter from being updated.

When an I mark switch 28E is depressed during the recording or stopping of the recorder, an I mark is displayed on the LCD 30 for several seconds (FIG. 4J), and data with the I mark is recorded. By virtue of the I mark, the data can be retrieved and reproduced afterward. Since 99 I marks can be recorded for all the letters, if the recording of the hundredth I mark is indicated by depression of the I mark switch 28E, an alarm is sounded and the I mark blinks for a predetermined period of time.

A recording mode switch 28F is a switch for switching the recording mode between an overwrite mode and an insert recording mode. The recording mode is usually is set in the overwrite mode. If data is recorded from the halfway part of a letter in the overwrite mode, recorded data is erased and then new data is recorded, as in a tape recorder. If, however, data has been recorded to the bottom of the letter, it is recorded in addition to that of the bottom of the letter, and data of the next letter is not erased. If the switch 28F is depressed, the overwrite mode is switched to the insert recording mode, and the INS mark is always displayed (FIG. 4C). When data is recorded on the halfway part of a letter in the insert recording mode, the recorded data is not erased. The recording mode switch 28F is a toggle switch for switching the recording mode between the overwrite and insert modes. However, when power is on, the recording mode is reset in the overwrite mode. The remaining recordable time in the overwrite mode depends upon an unrecorded-data capacity of the solid memory 22 and a recorded-data capacity from the present position to the bottom of the letter. For instance, when data is recorded in a low sound quality mode from the head of a letter on which data is recorded for ten minutes in a high sound quality mode, the remaining recordable time is added twenty minutes.

A partial erasing switch 28G is used to erase arbitrary part of recorded data. First an operator operates any one of the operation switches for reproduction, FF, and REW to set the current position to the head or foot of a desired portion to be erased, and depresses the switch 28G. Thus "ERASE" is displayed on the LCD 30 (FIG. 4K), the LED 32 blinks, and the current position is stored as an erase start position. The operator then operates any one of the operation switches for reproduction, FF, and REW to shift the position to the desired portion. During this shift, both "ERASE" of LCD 30 and LED 32 continue to blink. If the operator depresses the switch 28G again after the position is shifted, both the "ERASE" and LED 32 are lit for several seconds, and the data recorded on the desired portion is erased in several seconds. The range of the portion can be set either in a forward direction or in a backward direction, and may cover a plurality of letters. If a letter protected from erroneous erasure falls within the set range, an alarm is sounded and simultaneously the display of the protect (FIG. 4M) and LED 32 blink for several seconds, and only the unprotected letter is erased.

If the erasing range is set and the partial erasing switch 28G is depressed twice, both "ERASE" of the LCD 30 and the LED 32 are lit for several seconds, and data is reserved to erase for this period of time. If, in this time, a reset switch 28H is depressed or the slide switch 28A is turned on, that is, the power switch is turned off, the erasure is canceled. This operation is effective in preventing erroneous erasure. During the reservation for erasure, any operation switches other than the reset switch 28H and slide switch 28A (power switch) cannot be operated. In the first embodiment of the present invention, a partial erase mode is reset by canceling a partial erase start position and an erase end position by the reset switch 28H. However, only the erase end position can be erased to return the display to that of partial erasure.

When the erasing range is set so as to cover a plurality of letters, data is erased for each of the letters, and the E mark indicating the boundary between the letters is not erased. If the whole of one letter is erased, the number of the next letter is lowered. In the first embodiment, when the erasing range covers a plurality of letters, one or more E marks can be deleted from the range to process the letters as a single one.

Once a whole letter erasing switch 28I is depressed, "ERASE" (FIG. 4K) is displayed on the LCD 30, and the LED 32 is lit. If the switch 28I is released at this time, the LED is lit for several seconds and then a letter of the current position is erased. If the switch 28I continues to be depressed for several second after the LED 32 is lit, the whole letter erasure is displayed (FIG. 4L), and the entire contents stored in the solid memory 22 are erased in several seconds. If the reset switch 28H is depressed during the erasure reservation of several seconds or the slide switch 28A is turned on, that is, the power switch is turned off, the erasure is canceled. During the reservation, any operation switches other than the reset switch 28H and slide switch 28A (power switch) cannot be operated. If a target letter is protected from erroneous erasure, an alarm is given to inhibit it from being erased, and only the unprotected letter is erased, and the numbers of the letters subsequent to the erased letter are lowered.

In both the partial and whole erasures described above, data is erased within one second. If, however, the erasing range is wide or the number of letters is large, the erasing time is lengthened; therefore, the "ERASE" (FIG. 4K) and LED 32 can be blinked at different cycles.

If the recording mode selection switch 28F and partial erasing switch 28G are depressed at the same time, the letter relative to the current position is protected, and protect information is displayed for several seconds (FIG. 4M). Protect information is stored in the solid memory 22 along with the recorded data. The protected letter relative to the current position is always displayed by an outlined "P" mark (FIGS. 4D and 4J). If the switches 28F and 28G are depressed again at the same time with respect to the protected letter, the protect is released and the "P" mark is deleted, with the result that the protect information is erased from the recorded data.

When a recording switch 28J is depressed once, recording information is displayed (FIG. 4F), and the LED is lit, thereby recording data. If recording is started in the overwrite mode on a letter which is protected from erroneous erasure, an alarm is raised, and the display of protect is blinked (FIG. 4M), thus inhibiting the recording. If, however, the recording start position is located on a new letter or at the bottom of a letter where includes no data to be erased, the recording is executed irrespective of whether the letter is protected or not.

When the remaining time of the solid memory 22 is 90 seconds or less, an alarm is sounded every 15 seconds, and the remaining time is displayed flickeringly (segment section 30F of FIG. 3). If the capacity of the memory 22 runs out, an alarm is raised to stop recording (FIG. 4S). To stop recording, a stop switch 28K or a reproduction switch 28L is depressed. If, during the recording, the slide switch 28A is turned on, that is, the hold switch is turned on (or the power switch is turned off), the recording is continued, and no signals are received from the operation switches.

The stop switch 28K is used to stop reproduction, FF, and REW as well as recording. If any operation signals are not supplied for several minutes in the stopping state, the state is shifted to the standby state, and the power is turned off (FIG. 4A). If, in the standby state, any operation signal is input, the standby state is released and shifted to the operation mode.

The reproduction is performed by depressing the reproduction switch 28L (FIG. 4D). If the slide switch 28C is set in the fast reproduction mode, fast reproduction information is displayed (FIG. 4E), and the reproduction is executed at the speed 1.5 times as high as the normal speed. If the reproduction of one letter is completed, the subsequent letter is reproduced. When the former letter is changed to the latter letter, an alarm is sounded, and the recording date and time of the latter letter are displayed for several seconds (FIG. 4N). At the bottom of the final letter, an alarm is sounded, and end information is displayed (FIG. 4R), thus completing the reproduction. If it is detected during the reproduction that an I mark signal is added to the recorded data, the I mark is displayed flickeringly for several seconds (FIG. 4J). If a FF switch 28M is depressed during the reproduction, the current position skips to the head of the next letter. Then the recording date and time of the next letter are displayed for several seconds, and the reproduction starts from the head of the letter. Similarly, if a REW switch 28N is depressed, reproduction starts from the head of a letter previous to a letter under reproduction. Even though the FF switch 28M is depressed during the reproduction of the final letter or the REW switch 28N is depressed during the reproduction starting from the first letter, nothing changes. If, during the reproduction, the slide switch 28A is turned on, that is, the hold switch is turned on (or the power switch is turned off), the reproduction is continued, and no signals are received from the operation switches.

If the REW switch 28N is depressed in the stop state, REW is displayed (FIG. 4H) and an address is fast gone backward. The REW speed is processed by recording time, irrespective of the actual memory capacity. In other words, the capacity of a memory used in a high sound quality mode is twice as large as that of a memory used in a low sound quality mode, but the REW speeds in these modes are the same. The REW speed is three times as high as the normal REW speed for the first several seconds and, in other words, the recorded data of three seconds is returned for one second. After that, the REW switch 28N accelerates the REW speed to 6-fold, 12-fold, 24-fold, 48-fold, and 96-fold speeds every several seconds. The REW continues until the head of a target letter appears. If the current position is located at the head of a letter, the REW starts from the bottom of the previous letter. When the REW reaches the head of the letter, an alarm is raised to inhibit the REW. No speech signals are generated during the REW.

If the FF switch 28M is depressed in the stop state, FF is displayed (FIG. 4G) and recorded data is fast-forwarded. Like the REW switch 28N, the FF switch 28M accelerates the FF speed to 3-fold to 96-fold speeds every several seconds. The FF continues until the bottom of a letter appears. If the current position is located at the bottom of a letter, the FF starts from the head of the subsequent letter. When the FF reaches the bottom of the final letter, an alarm is sounded, and end information is displayed (FIG. 4R) to inhibit the FF. If the slide switch 28A is turned on during the FF or REW, that is, the hold switch is turned on (or the power switch is turned off), the FF or REW is continued, and any other operations are inhibited from being carried out. After the FF or REW is finished, the power switch is cut off.

Figure 5:
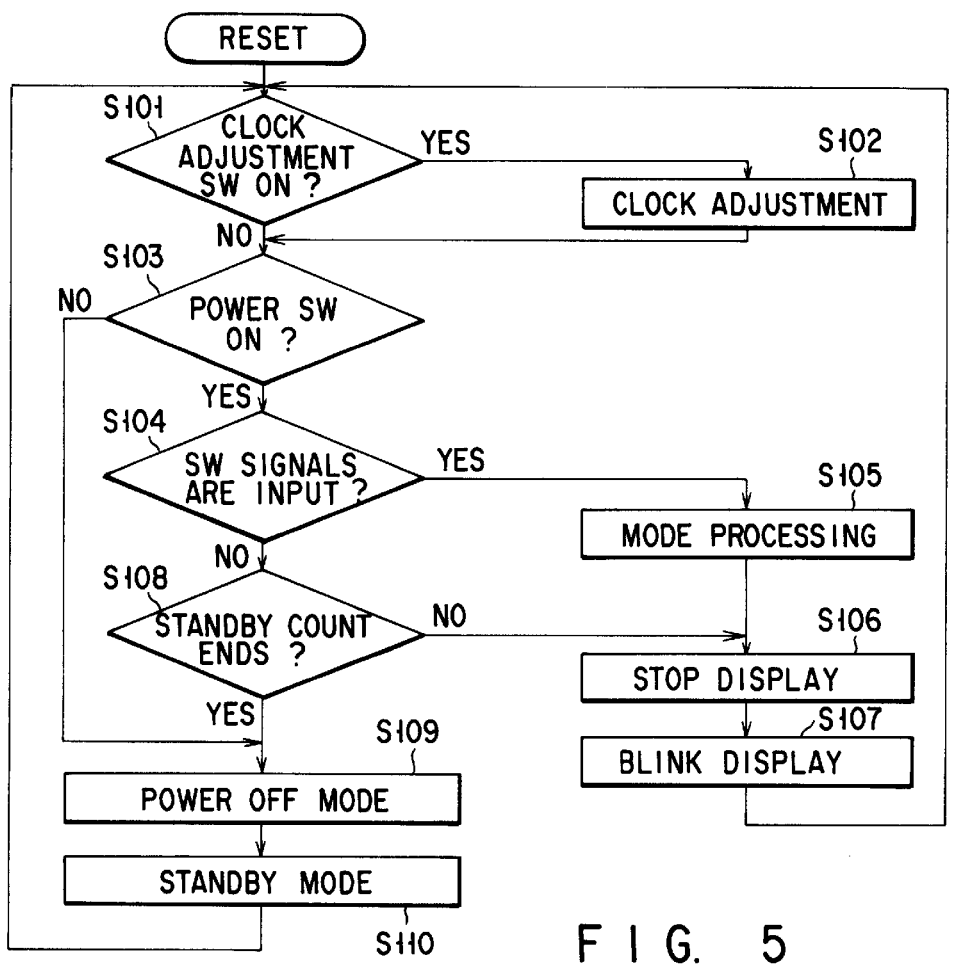
FIG. 5 is a flowchart showing a main routine after the system is reset.

FIG. 5 is a flowchart showing a main routine executed by the CPU 20 after the system of the digital recorder 10 is reset.

The internal circuit of the digital recorder is reset by resetting the system thereof. It is first detected whether a clock adjustment switch (not shown) is turned on (step S101). If the switch is depressed, the clock is displayed (FIG. 4A) to adjust a built-in clock (step 102). It is then detected whether the slide switch 28A is turned off or the power switch is turned on (step S103). If the power switch is turned on, it is determined whether an operation signal is input from the operation switches (step 104). If the operation signal is input, the modes are processed in response thereto (step S105). After the mode processing (which will be described later), the stop state is displayed (step S106) and then the blink display is executed (step S107).

If no operation signals are input from the operation switches in step S104, the standby state is counted (step S108). When the count of the standby state is completed or if no operation signals are supplied for not less than a predetermined period of time, the mode is changed to a power-off mode (step S109). Even when the power switch is turned off in step S103, the mode is shifted to the power-off mode (step S109). Thereafter, the display is switched to clock display (FIG. 4A), the power is cut off, and the power-off mode is shifted to the standby mode (step S110). In this standby mode, the power of respective components of the digital recorder 10 is cut off, but both a clock function and a clock display function are fulfilled. The standby mode is released by any one of the operation switches. The flow is returned to the step S101 after the power switch is turned on.

Figure 6A:
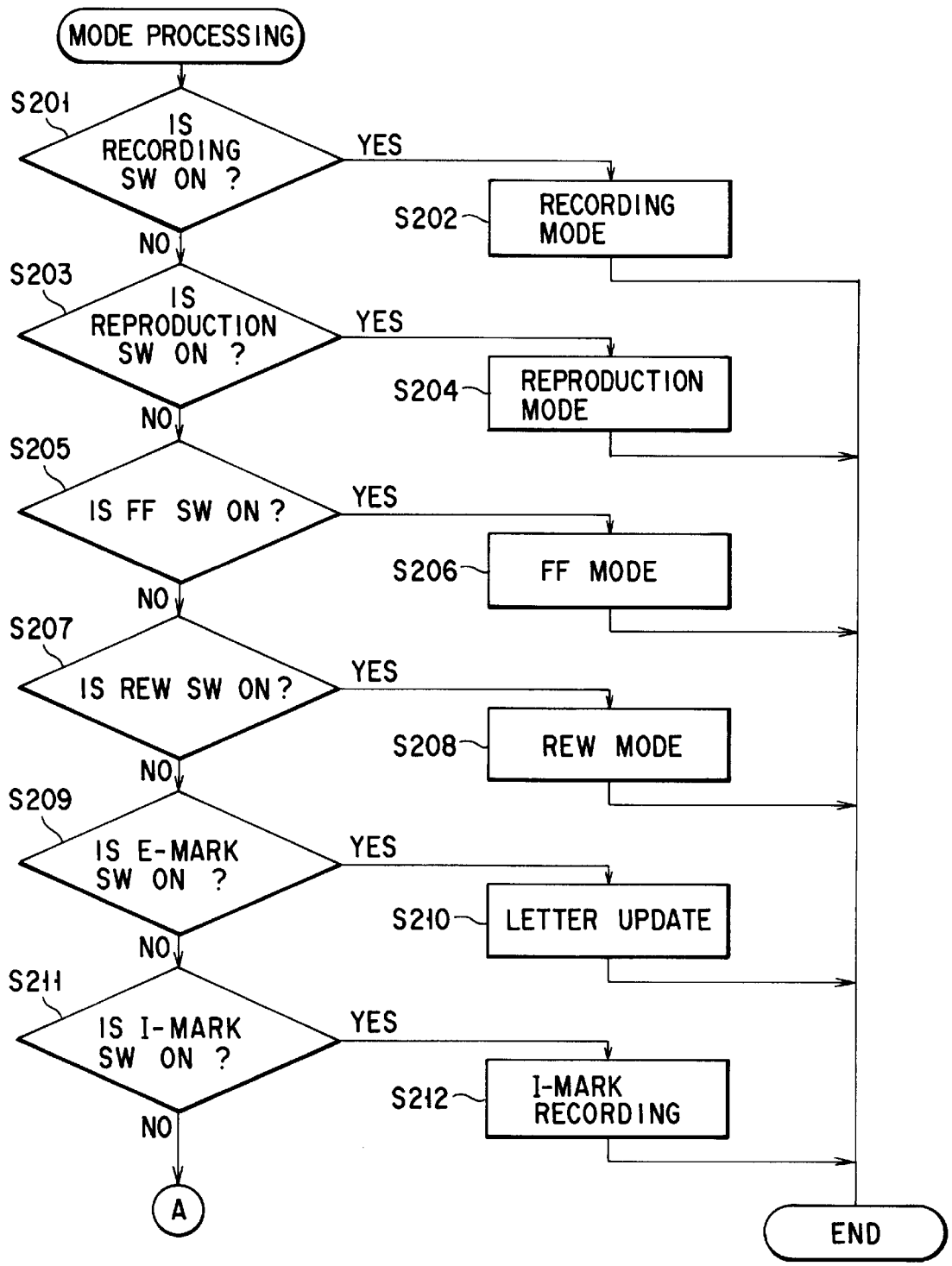
FIGS. 6A and 6B are a flowchart of a mode processing shown in FIG. 5.
Figure 6B:
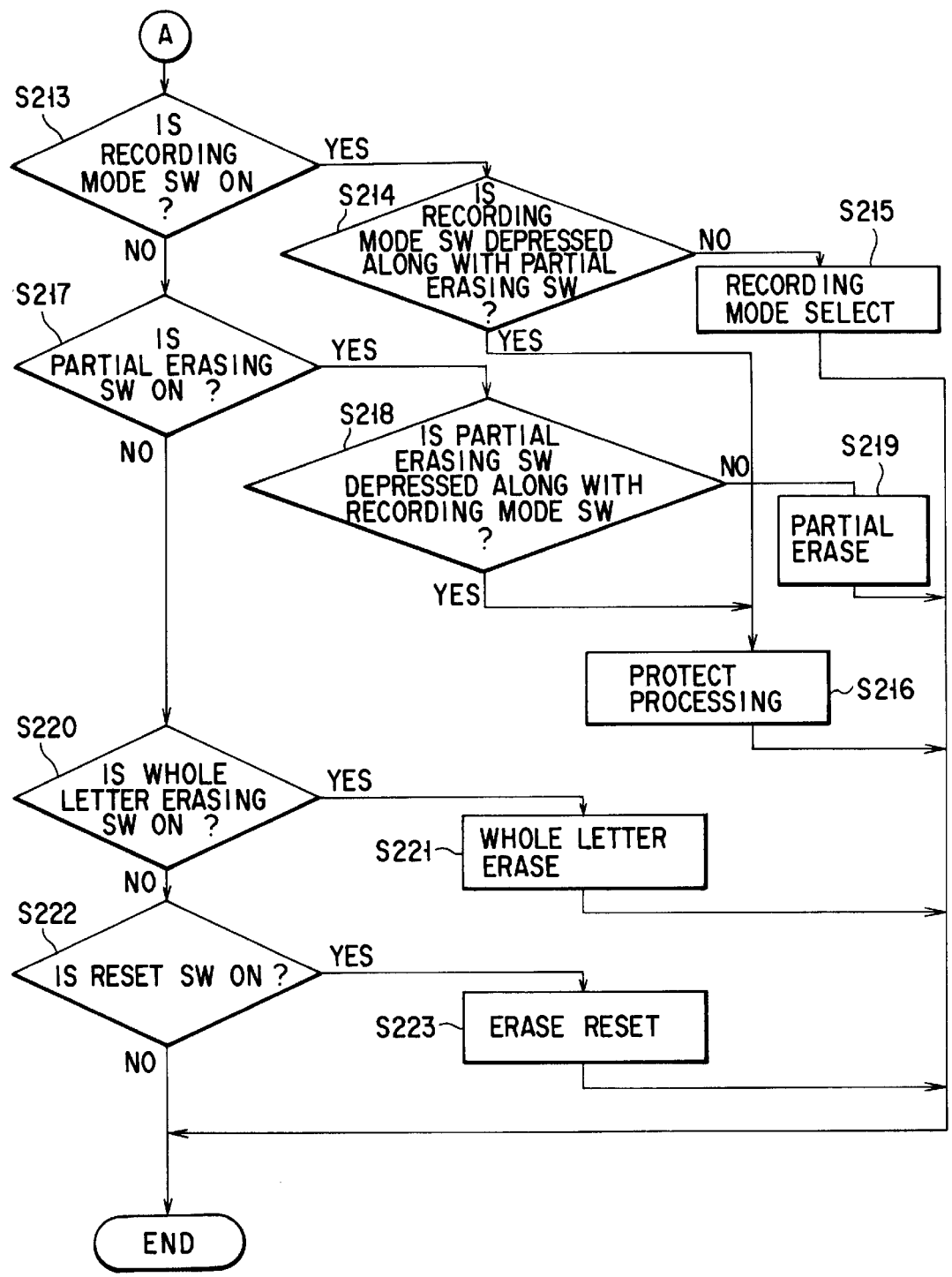

FIGS. 6A and 6B are a flowchart showing in detail the mode processing of step S105.

If the operation switch operated in step S104 is the recording switch 28J and it is turned on (step S201), the mode is changed to the recording mode (step S202), or if the reproduction switch 28L is turned on (step S203), the mode is changed to the reproduction mode (step S204). These recording and reproduction modes will be described in detail hereinafter.

If the operation switch is the FF switch 28M and it is turned on (step S205), the mode is shifted to the FF mode (step S206) to execute the FF. If the REW switch 28N is turned on (step S207), the mode is changed to the REW mode to execute the REW (step S208). When the E mark switch 28D is turned on (step S209), the letter is updated (step S210). If the I mark switch 28E is turned on (step S211), an I mark signal is added to the recorded speech data located at the current position (step S212).

If, furthermore, the operation switch is the recording mode switch 28F and it is turned on (step S213), it is determined whether the switch is depressed at the same time when the partial erasing switch 28G (step S214). If these switches are not depressed simultaneously, the recording mode is changed (step S215). If they are depressed simultaneously, the setting of partial erasure (the display of erasure) is canceled and then the protect processing for preventing erroneous erasure is executed (step S216).

If the operation switch is the partial erasing switch 28G and it is turned on (step S217), it is determined whether the switch is depressed at the same time when the recording mode switch 28F is depressed (step S218). If these switches are not depressed simultaneously, the partial erasure processing is executed (step S219). If they are depressed simultaneously, the recording mode is changed again, and the protect processing is executed in step S216.

In the protect processing, if a letter relative to the current position is not protected, it is protected, and the protect information is additionally recorded on speech data and simultaneously displayed for several seconds (FIG. 4M). If the letter has been protected, the protect state is released and the protect information is erased from the speech data.

If the operation switch is the whole letter erasing switch 28I and it is turned on (step S220), the whole letter is erased (step S221). If the switch 28I is not turned on but the reset switch 28H is turned on (step S222), the setting of a partial erasing range is canceled and the display of erase is deleted (step S223).

Figure 7B:
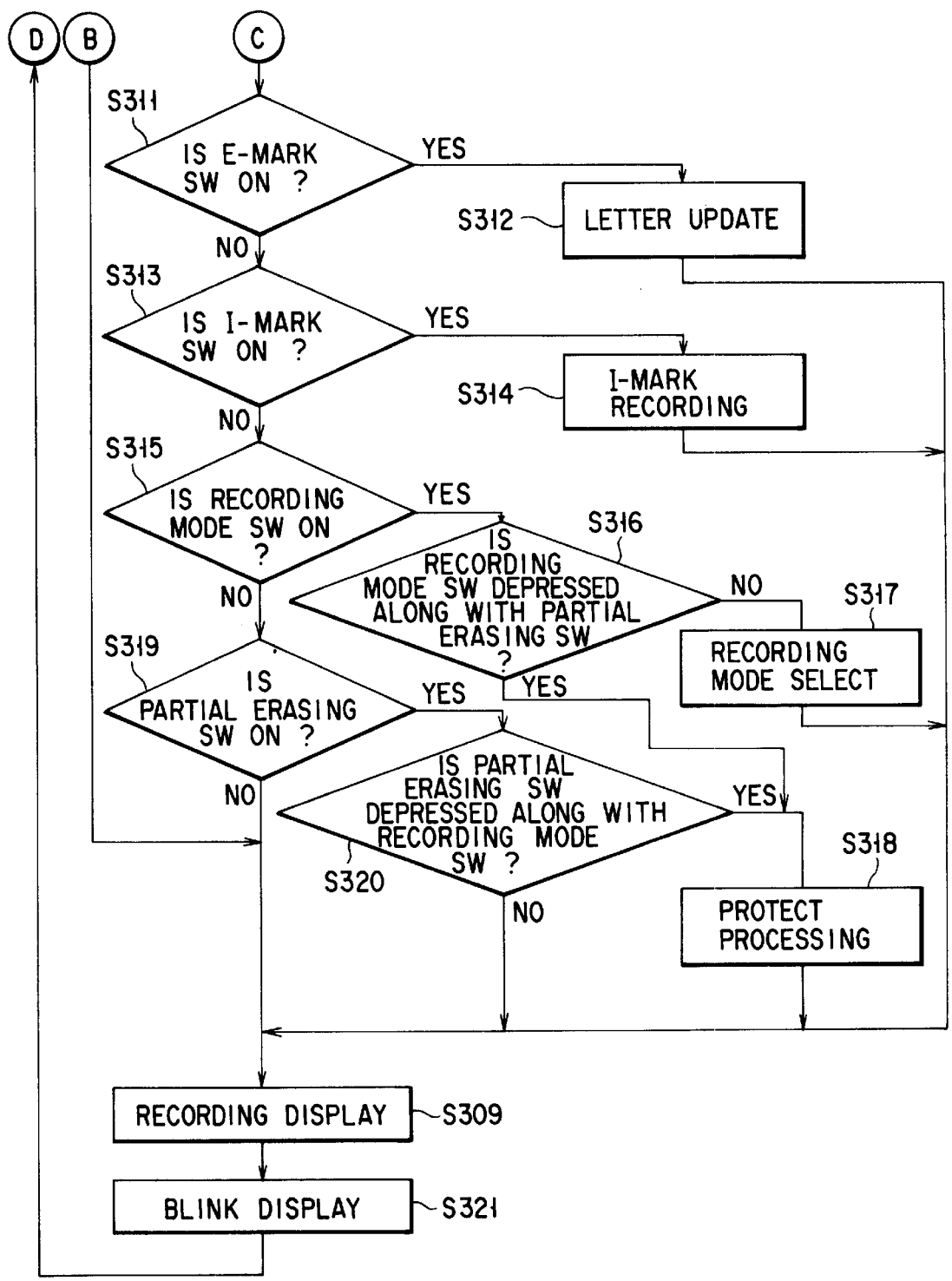

FIGS. 7A and 7B are a flowchart showing in detail the recording mode of the step S202.

First "REC" is displayed to indicate the recording mode (FIG. 4F) and at the same time the LED 32 is lit (step S301). If no recordable memory capacity remains (step S302), the display of end is made (FIG. 4S) and an end alarm is sounded (step S303). The display of end is blinking while the alarm is being sounded.

If a recordable memory capacity remains and if a letter relative to the current position is protected when recording is started from the halfway part of the letter in the overwrite mode (step S304), protect information (FIG. 4M) blinks and a protect alarm is raised (step S305).

If the letter is not protected, data is recorded frame by frame (step S306). When no recordable memory capacity remains (step S307), the flow advances to the step S303, in which the end information is displayed and the end alarm is sounded.

If a recordable memory capacity remains, it is determined whether the slide switch 28A, i.e., the hold switch is turned on or not (step S308). If it is turned on, in other words, if the power switch is turned off, recording information is displayed (step S309). When the hold switch is turned off, it is determined whether an operation signal is input from an operation switch (step S310). In other words, if an operation signal is input from either the stop switch 28K or the reproduction switch 28L, the recording ends.

If no operation signals are input in step S310, it is determined whether the E-mark switch 28D is turned on (step S311). If the switch 28D is turned on, the letter is updated (step S312). If the switch 28D is turned off, it is determined whether the I-mark switch 28E is turned on (step S313). When the switch 28E is turned on, the I-mark signal is additionally recorded on speech data, and the I mark (FIG. 4J) is displayed (step S314).

When the I-mark switch 28E is off, it is determined whether the recording mode switch 28F is on or off (step S315). When the switch 28F is on, it is determined whether the switch 28F is depressed simultaneously with the partial erasing switch 28G (step S316). If they are not depressed at a time, the recording mode is switched (step S317). If they are depressed at a time, the protect processing is executed (step S318).

If it is determined in step S315 that the recording mode switch 28F is turned off, then it is determined whether the partial erasing switch 28G is turned on or not (step S319). If the switch 28G is on, it is determined whether the switch 28G is depressed simultaneously with the switch 28F (step S320). When they are depressed at a time, the reproduction mode is switched again and the protect processing of step S318 is executed. In the recording mode, no erasing operation is performed.

If it is determined in step S319 that the partial erasing switch 28G is turned off, the letter number of the current position, the recording time starting from the head of the letter, and the remaining recordable time are displayed again in step S309. The recording display of step S309 is returned to the original one (FIG. 4F) after a predetermined period of time by counting the display time of the contents displayed in the steps S312, S314 and S318.

After that, blink display is performed (step S321). In the recording mode, a warning of low battery voltage (FIG. 4P) and an E mark (FIG. 4I), which indicates that the number of letters exceeds 19 in step S312, are blinked.

Figure 8A:
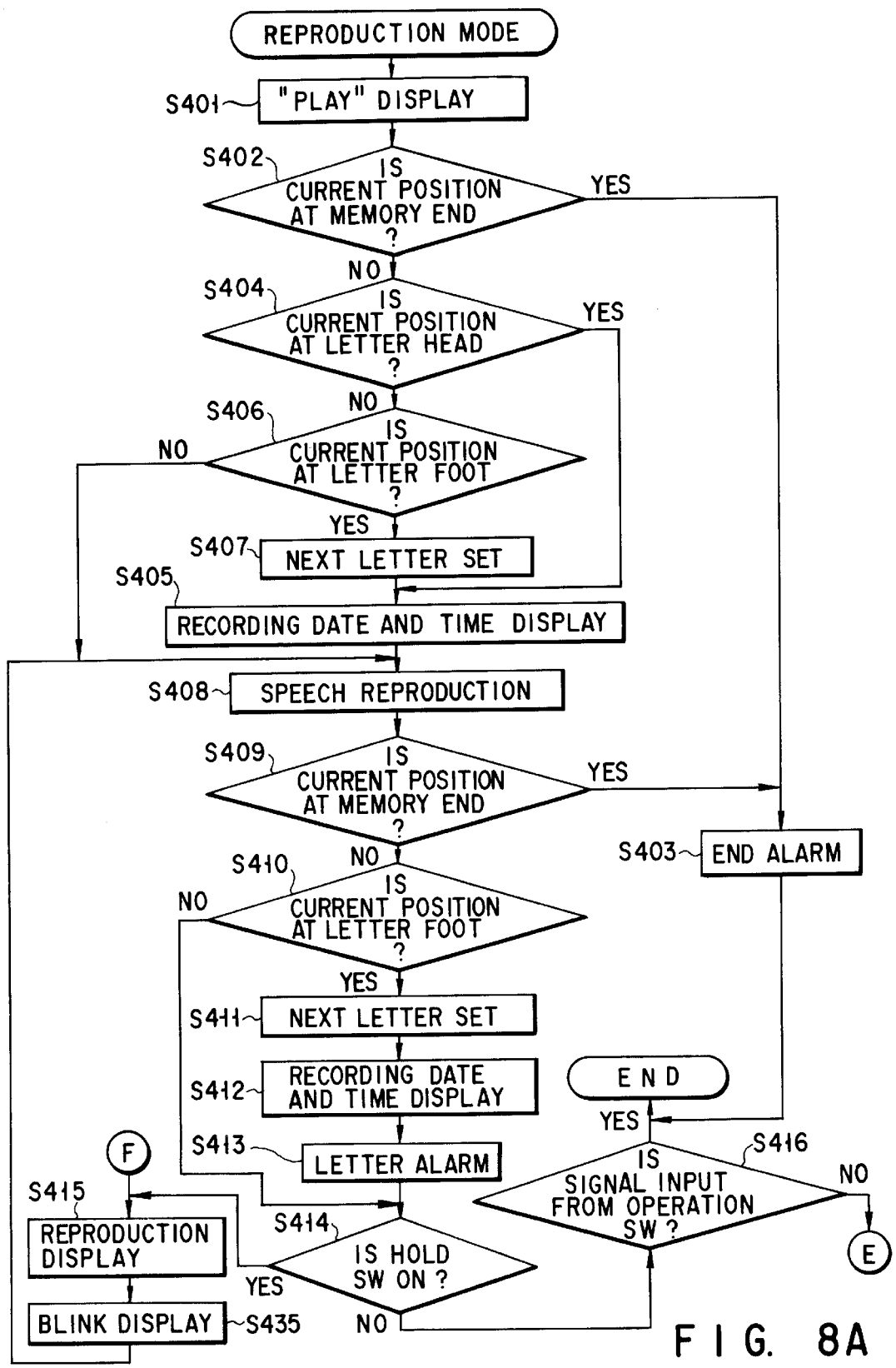
FIGS. 8A and 8B are a flowchart of a reproduction mode processing shown in FIG. 6A.
Figure 8B:
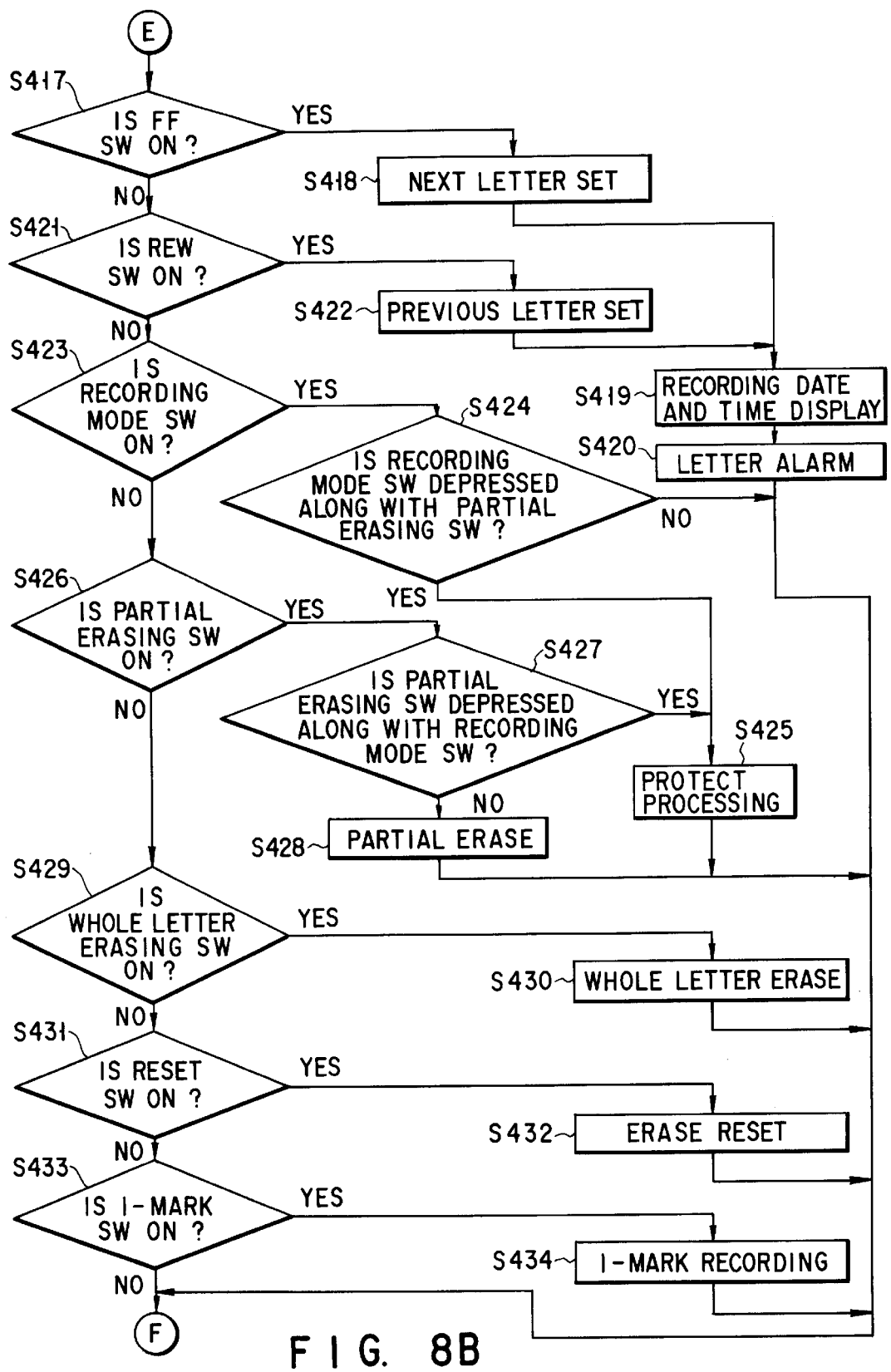

FIGS. 8A and 8B are a flowchart showing in detail the reproduction mode of the step S204.

First "PLAY" is displayed (FIGS. 4D and 4E) in the reproduction mode in accordance with the reproduction speed set by the slide switch 28C (step S401). When the current position is located at the end of the memory, that is, when it is at the bottom of the final letter or no data is recorded (all data of the memory is erased) (step S402), end information is displayed (FIG. 4R) and an end alarm is sounded (step S403).

If the current position is not located at the end of the memory, then it is determined whether the current position is located at the head of a letter (step S404). If YES in step S404, the recording date and time of the letter is displayed (FIG. 4N) (step S405).

If the current position is not located at the head of the letter, then it is determined whether the current position is located at the bottom of the letter (step S406). If YES in step S406, the subsequent letter is set (step S407) and, in other words, a read address is set at the head of a letter having the next letter number. The flow then advances to step S405, and the recording date and time is displayed.

If it is determined in step S406 that the current position is not located at the bottom of the letter, speech reproduction is performed (step S408), and it is determined whether the current position is located at the end of the memory (step S409). If the position is at the end of the memory, the flow advances to the step S403, end information is displayed (FIG. 4R), and an end alarm is raised.

If the current position is not located at the end of the memory, then it is determined whether data has been reproduced so far the bottom of the letter (step S410). If YES in step S410, the next letter is set (step S411) and, in other words, a read address is set to the head of a letter having the next number. The recording date and time of the letter is displayed (step S412), and a letter alarm for informing an operator that the letter is changed during the reproduction is sounded (step S413).

If NO in step S410, it is determined whether the slide switch 28A is turned on or whether the hold switch SW is turned on (step S414). If it is turned on, reproduction information is displayed (step S415).

When the hold switch is off, it is determined whether a signal is input by an operation switch, that is, whether either the stop switch 28K or recording switch 28J is turned on or not (step S416). When either of them is turned on, the reproduction ends.

If it is determined in step S416 that no operation signals are input, then it is determined whether the FF switch 28M is on or not (step S417). If YES in step S417, a read address is set to the head of a letter having the next letter number (step S418), and the recording date and time is displayed (FIG. 4N) (step S419), and a letter alarm indicating that the letter is switched is sounded (step S420). Then the flow advances to step S415.

When the FF switch 28M is off, it is determined whether the REW switch 28N is on or off (step S421). If the switch 28N is on, an address is set to the head of a letter prior to the present letter (step S422), and the flow advances to step S419.

When the REW switch 28N is off, it is determined whether the recording mode switch 28F is on or off (step S423). If the switch 28F is on, then it is determined whether the switch 28F is depressed simultaneously with the partial erasing switch 28G (step S424). If they are depressed at a time, the setting of partial erasure is canceled, and the protect processing executed (step S425). If they are not depressed at a time, the flow advances to step S415.

When the recording mode switch 28F is off, it is determined whether the partial erasing switch 28G is on or off (step S426). If the switch 28G is on, then it is determined whether the switch 28G is depressed simultaneously with the switch 28F (step S427). If they are depressed at the same time, the protect processing of step S425 is executed. If they are not, the partial erasure is performed (step S428), and the flow goes to step S415. During the reproduction, the recording mode is not changed.

When the partial erasing switch 28G is off, it is determined whether the whole letter erasing switch 28I is on or off (step S429). If the switch 28I is on, the whole letter is erased (step S430), and the flow advances to step S415. If the switch 28I is off, then it is determined whether the reset switch 28H is on or off (step S431). If the switch 28H is on, the setting of partial erasure is canceled, and the blink of erase display is stopped (step S432). The flow thus goes to step S415.

When the reset switch 28H is off, it is determined whether the I-mark switch 28E is on or off (step S433). If it is on, an I-mark signal is recorded to speech data of the reproduced frame, and an I mark (FIG. 4J) is displayed (step S434). The flow goes to step S415.

Even when the I-mark switch 28E is off, the flow goes to step S415, and the number of a letter relative to the current position, the recording time starting from the head of the letter, and the remaining recordable time are displayed again in step S415; however, they are not displayed for a predetermined period of time if the recording date and time are displayed in the steps S405, S412 and S419. Furthermore, if the recording date and time are displayed in these steps, if the protect information is displayed in step S425, and if the I mark is displayed in step S434, the display time is counted, and the reproduction display of step S415 is returned to the original one (FIGS. 4D and 4E) after a lapse of a predetermined period of time. However, the display of erase information (FIG. 4K) blinks while the partial erasing range is set.

Following the reproduction display in step S415, the blink display is performed (step S435) and the flow returns to step S408. During the reproduction, a warning of low battery voltage (FIG. 4P) and erase information (FIG. 4K) are blinked. If the I-mark signal is recorded on the reproduced speech data, the I mark (FIG. 4J) is blinked for a predetermined period of time.

Figure 9A:
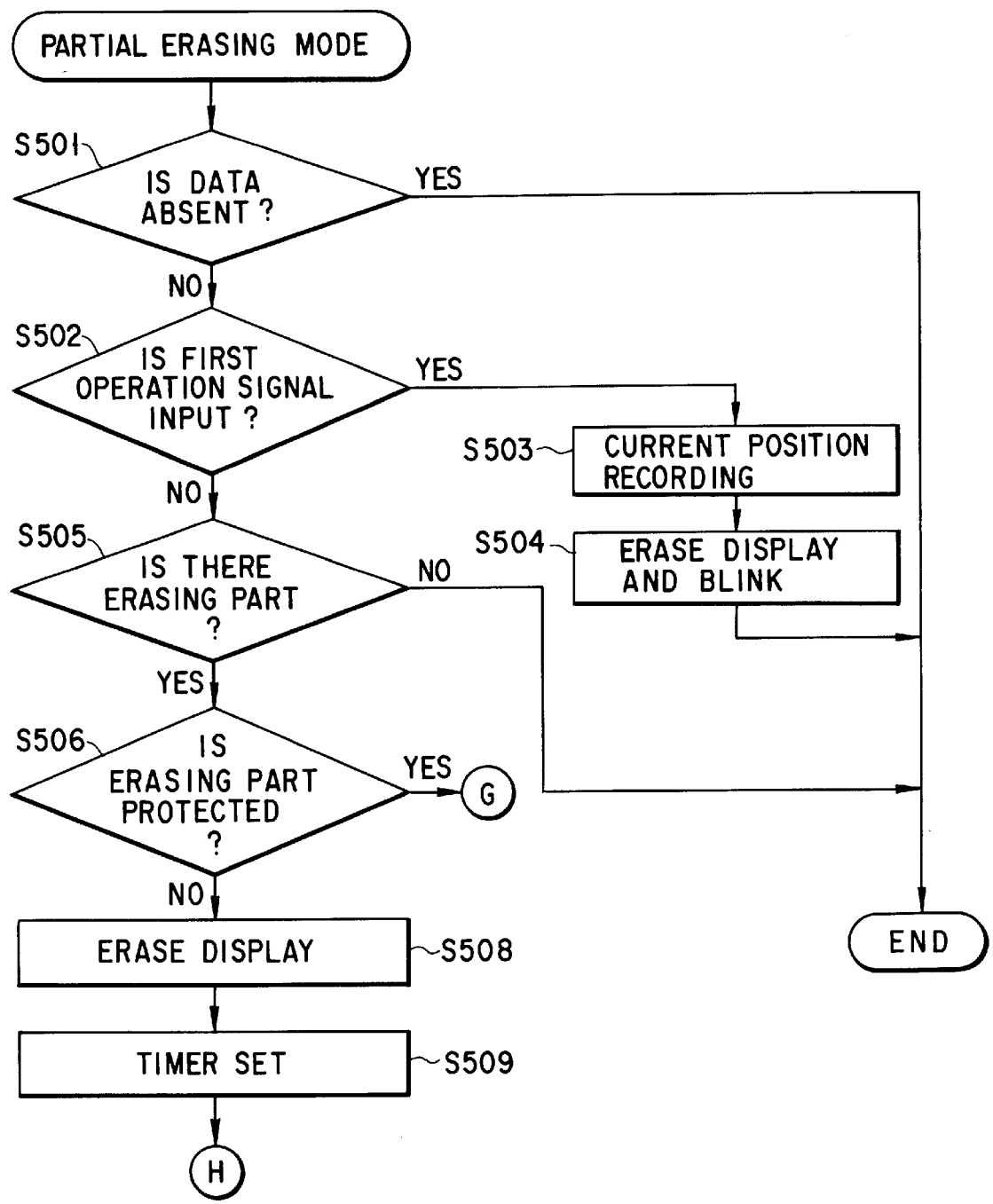
FIGS. 9A and 9B are a flowchart showing a partial erasing process in FIGS. 6B and 8B.
Figure 9B:
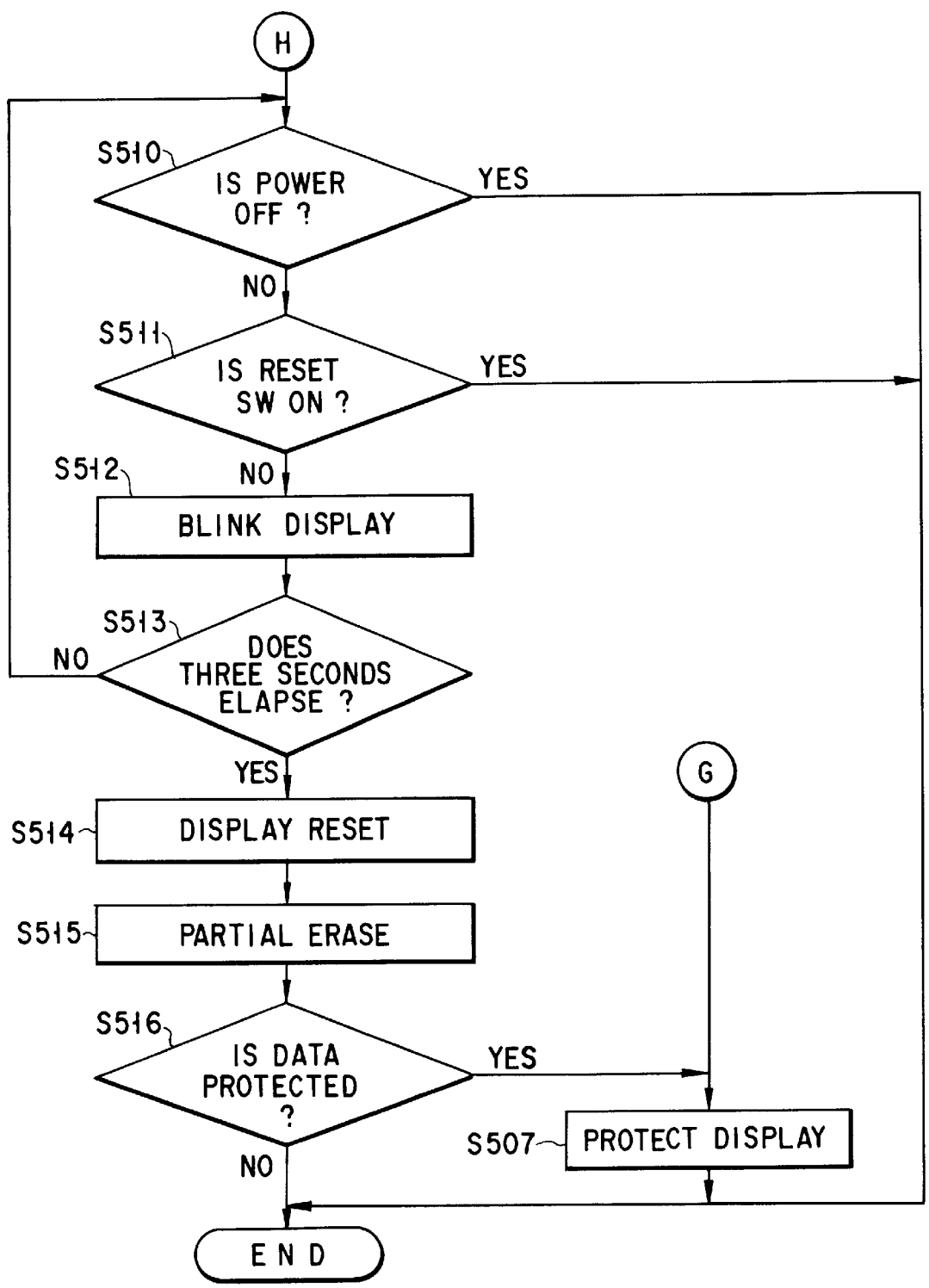

FIGS. 9A and 9B are a flowchart showing in detail the partial erasing mode of the steps S219 and S428.

First it is determined whether recorded data is present or not (step S501). If no recorded data is present, no operation is performed. If recorded data is present, then it is determined whether an operation signal input by the partial erasing switch 28G is the first one or not, in other words, it is determined whether the setting of partial erasure starts or ends (step S502). If it is determined that the first operation signal is input, the current position is stored (step S503), and both the display of "ERASE" (FIG. 4K) in the LCD 30 and the blink of the LED 24 are set. The partial erasing mode thus starts (step S504).

If it is determined that the second operation signal is input, the range of partial erasure is defined, with the result that the setting of partial erasure ends. It is then determined whether an erasing portion is present or not (step S505), in other words, it is determined whether the erasure start position and current position stored in the step S503 are the same or not. If these positions are the same, there is no speech data to be erased. The partial erasing mode therefore ends.

If the positions are not the same or if the erasing portion is present, then it is determined whether the data is protected or not (step S506). In other words, it is determined whether all the speech data from the erasure start position to the current position is protected from erroneous erasure. If both these positions are included in the same letter, it is determined whether the present letter is protected or not. If the positions are included in different letters, protect information of these letters and that of all letters interposed between them are detected. If all the letters are protected, the protect information (FIG. 4M) is displayed flickeringly for a predetermined period of time, and a protect alarm is sounded (step S507).

If there is a letter not protected, erase information is displayed (step S508). More specifically, "ERASE" is displayed continuously on the LCD 30 (FIG. 4K) and the LED 32 is turned on. Then, a timer is set to delay the execution of erasure by three seconds (step S509) and, in other words, an operator has to wait for three seconds. When the slide switch 28A is turned on (the power switch is turned off or the hold switch is turned on) (step S510), or the reset switch 28H is turned on (step S511), no erasing operation is performed, and the partial erasing mode ends.

If the power switch is on and no signals are input by the reset switch 28H, the blink display is executed (step S512), and the operator waits for three seconds (step S513). The blink display of step S512 is executed only to warn the operator that the battery voltage is lowered.

After a lapse of three seconds, erase information is displayed on the LCD 30 and the LED 32 is turned off (step S514), thereby executing the partial erasure (step S515). This partial erasure is applied to all speech data which is not protected between the erasing start position and the current position.

It is then determined whether at least part of the speech data between the erasing start position and the current position is protected or not (step S516). If YES in step S516, the flow goes to step S507, the protect information (FIG. 4M) is blinking for a predetermined period of time, and the protect alarm is sounded.

Figure 10A:
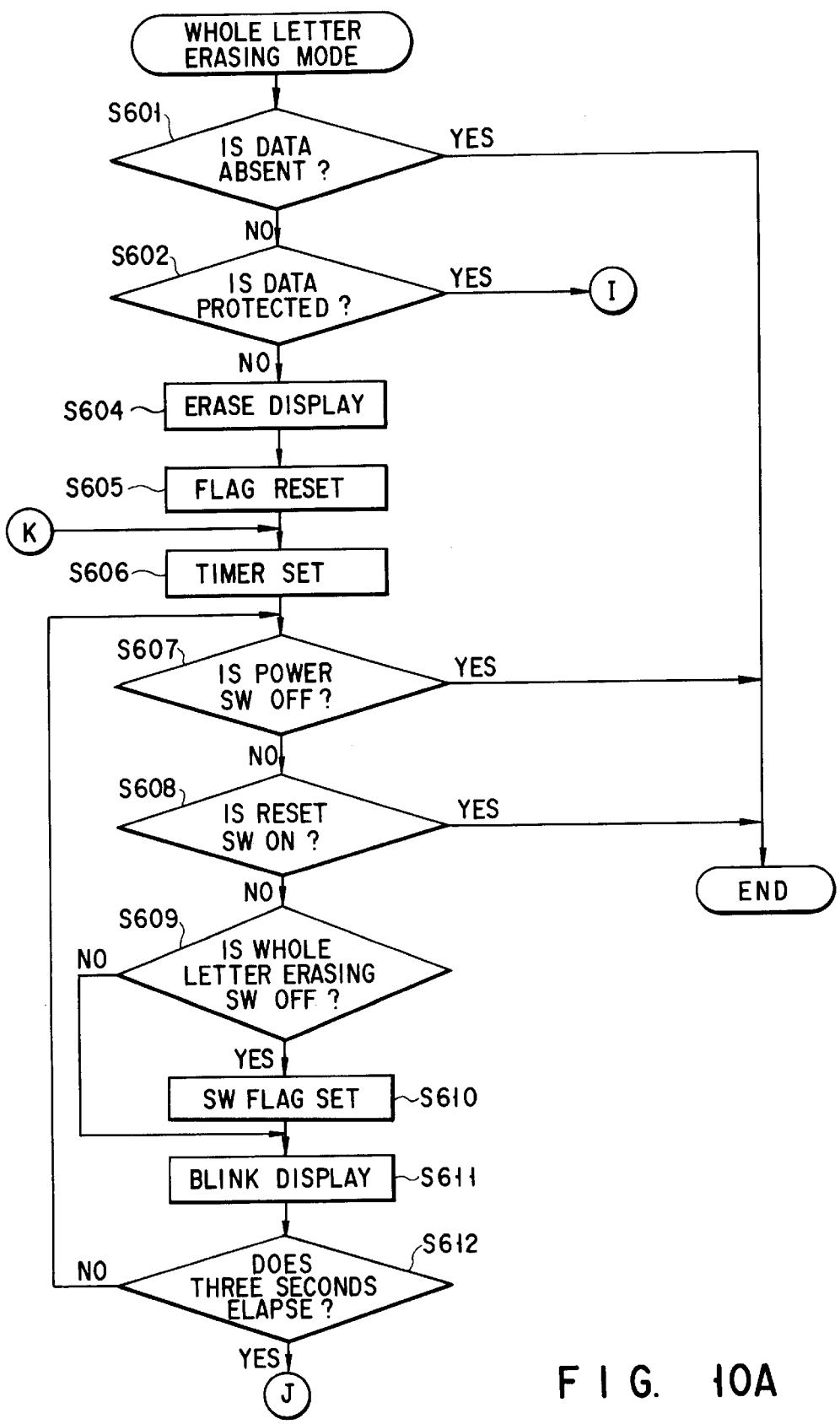
FIGS. 10A and 10B are a flowchart showing a whole letter erasing process in FIGS. 6B and 8B.
Figure 10B:
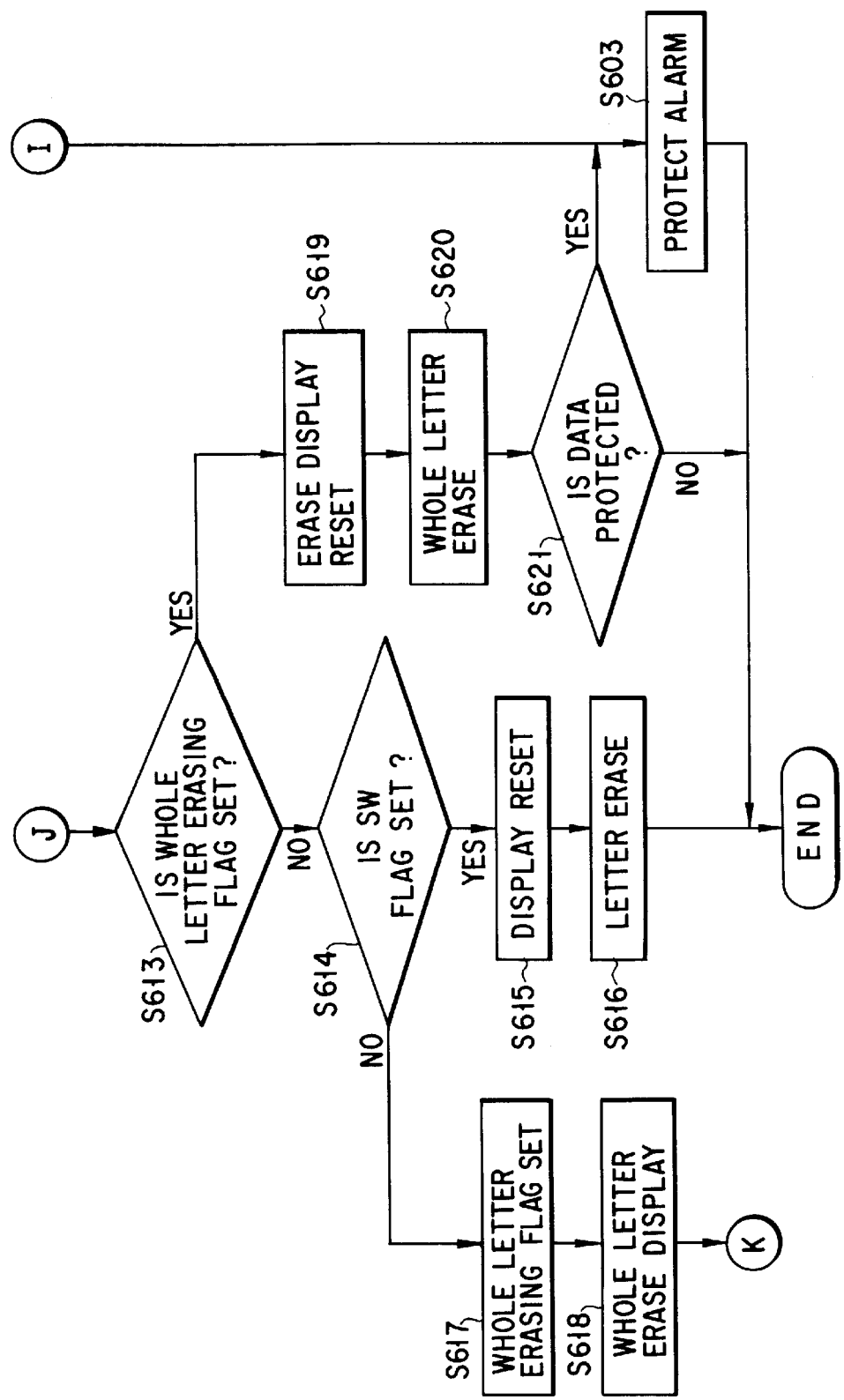

FIGS. 10A and 10B are a flowchart showing in detail the whole letter erasing mode of the steps S221 and S430.

First it is determined whether recorded data is present or not (step S601). If no recorded data is present, no operation is performed. If recorded data is present, then it is determined whether a letter of the current position is protected or not (step S602). If it is protected, the protect information (FIG. 4M) is blinking for a predetermined period of time and the protect alarm is raised (step S603). The whole letter erasing mode thus ends.

If the letter is not protected, both the display of erase (FIG. 4K) and the LED 32 are lit (step S604). After that, a switch flag for determining whether the erasing switch 28I continues to be depressed for three seconds and a whole letter erasing flag for determining whether the whole letter erasure is executed, are reset (step S605). A timer for changing the mode to the whole letter erasing mode by continuing depressing the erasing switch 28I for three seconds and a three-second timer for delaying the execution of erasure by three seconds, are set (step S606). When the slide switch 28A is turned on (the power switch is turned off or the hold switch is turned on) (step S607), or the reset switch 28H is turned on (step S608) while the timers are counting, the erasing operation is stopped, and the whole letter erasing mode is completed.

During the counting, it is determined whether the whole letter erasing switch 28I is turned off (step S609). If the switch 28I is off, the switch flag is set (step S610). If the switch is on, an operation for blink display is carried out (step S611) and, in this step, it is only a warning of low battery voltage that blinks (FIG. 4P). It is then determined whether three seconds elapses or not (step S612). If NO in step S612, the flow returns to step S607.

If YES in step S612, then it is determined whether the whole letter erasing flag is set or not (step S613). This flag is not set at first. If it is determined in step S613 that the flag is not set, it is determined whether the switch flag is set or not (step S614). If the switch flag is set in step S614, in other words, when the whole letter erasing switch 28I is turned off in the first three seconds, the display of erase is turned off (step S615), and the letter of the current position is canceled (step S616).

If the switch flag is not set, in other words, if the switch 28I continues to be depressed for the first three seconds, the whole letter erasing flag is set (step S617) and the erasure of the whole letter (FIG. 4L) is displayed (step S618). The flow then returns to step S606, and the execution of erasure is delayed by three seconds.

If the power switch is not turned off or the reset switch 28H is not turned on in three seconds, it is determined again in step S613 whether the whole letter erasing flag is set or not. If the flag is set, the display of erase is turned off (step S619), and the whole letter is erased (step S620). In this whole letter erasure, all unprotected letters are erased. It is then determined whether a protected letter is present or not (step S621). If there is a protected letter, the flow advances to step S603, the protect information (FIG. 4M) is blinking for several seconds, and the protect alarm is sounded.

As described above, the whole letter erasing mode is executed after a lapse of three seconds after the whole letter erasing information is displayed by continuing depressing the erasing switch 28I for three seconds. If the power switch is turned off or the reset switch 28H is turned on in three seconds after the display of the whole letter erasing information, all erasing operations are stopped.

In the digital recorder of the above embodiment, data can be reproduced at a speed 1.5 times the normal speed by operating the slide switch 28C. The reproduction can be performed at a higher speed; however, in this case, a mechanism, which makes it difficult to cause an erroneous operation, is required and a control operation has to be performed in accordance with the high-speed reproduction.

A digital recorder capable of high-speed reproduction will now be described as a second embodiment of the present invention.

The constitution of the digital recorder is basically the same as that of the recorder according to the first embodiment. However, a stepless operation member 42, as shown in FIG. 11A, and a detection circuit 44, as shown in FIG. 11B, for detecting the member 42, are added to the digital recorder of the first embodiment. The detection circuit 44 includes a pressure sensor 44A having four resistors $R_{R1}$ to $R_{R4}$ and an A/D converter 44B interposed between the sensor 44A and CPU 20.

The operation member 42 includes a plate spring 42B one end of which is fixed and the other end of which is attached to a slide button 42A. Pressure sensitive resistor elements 42C and 42D, serving as resistors $R_{R3}$ and $R_{R4}$ of the sensor 44A, are adhered onto the plate spring 42B.

In FIG. 11A, when the slide button 42A is moved in the left direction, the resistor element 42C extends and increases in resistance, while the resistor element 42D shrinks and decreases therein; accordingly, a voltage $V_R$ applied from the sensor 44A to the A/D converter 44B decreases. The increase and decrease in resistance and voltage vary with the movement amount or the operation pressure of the slide button 42A.

The CPU 20 is therefore able to sense the operation pressure in the FF direction by the output voltage $V_R$ of the sensor 44A. In the second embodiment, if a voltage of -1.2 mV or lower is output from the sensor 44A, fast reproduction starts in the FF direction at a speed corresponding to the voltage or the operation pressure. The operation pressure in the REW direction (in the right direction of the slide button 42A in FIG. 11A) can be detected in the same manner. In the second embodiment, if a voltage of 1.0 mV or higher is output from the sensor 44A, fast reproduction starts in the REW direction at a speed corresponding to the voltage and the operation pressure. The relationship between the fast reproduction speeds in the FF and REW directions and the output voltage $V_R$ of the sensor 44A, is shown in FIG. 12.

FIG. 13 is a flowchart showing a process of adjusting a reproduction speed by operating the stepless operation member 42 during the speech reproduction in the above step S408.

The CPU 20 detects a voltage $V_R$ output from the sensor 44A to the A/D converter 44B to determine within which range a, b, c or d in FIG. 12 the voltage falls (step S701). In other words, the respective reproduction speeds are varied with information of the detected voltage (steps S702 to S705).

For example, when the resistor element 42C on the FF side receives any pressure, the resistance of resistor $R_{R3}$ increases according to the pressure, and the voltage $V_R$ output from the sensor 44A lowers. In the second embodiment, therefore, fast reproduction starts when a voltage of -1.2 mV or lower is output. The reproduction speed is varied with the output voltage of the sensor 44A.

If output voltage $V_R$ falls within range a in FIG. 12, the CPU 20 performs the normal (standard) speed reproduction to transfer speech data from a solid memory 22 to a DSP (digital signal processor) 18 (step S702).

If output voltage $V_R$ falls within range b, fast reproduction is executed at speeds 1.2 to 2 times the normal speed (step S703). If the voltage falls within range c, fast reproduction is done at speeds 2 to 4 times the normal speed (step S704). An instruction for each speed is supplied to the DSP 18.

If output voltage $V_R$ falls within range d, the CPU 20 causes an FF or REW operation to be performed at speeds 6 to 10 times the normal speed (step S705).

Figure 14:
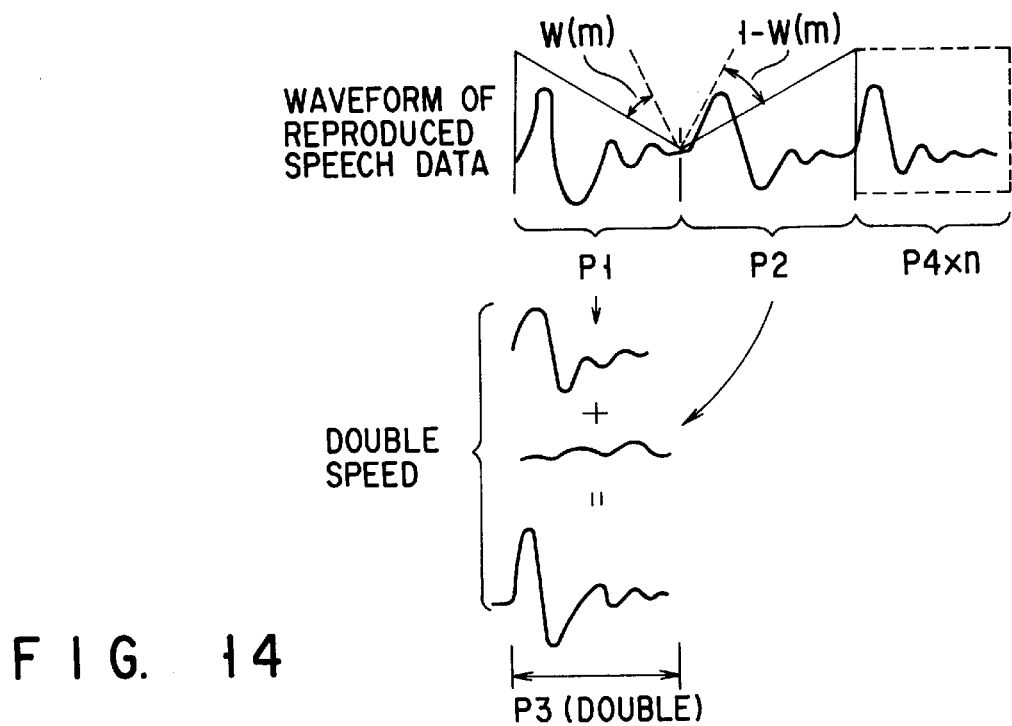
FIG. 14 is a waveform for explaining a time-axially compressing operation performed in the reproduction at a speed lower than 2 times the normal speed, as shown in the flowchart of FIG. 13.

In response to the instructions of step S703, a decoding section 18B of the DSP 18 executes the following processing. For example, in double-speed reproduction, as shown in FIG. 14, a weight window function [W(m)] is applied to the former section P1 of a waveform of reproduction speech data sent from the CPU 20, and its opposite weight window function [1-W(m)] is applied to the latter section P2 thereof. The waveforms of two cycles in these sections are added to each other and time-axially compressed to a waveform of one cycle by the TDHS (time domain harmonic scale) system. Since the two waveforms are averaged keeping the connection between them, an operator can hear the reproduced speech as a continuous sound. In 1.5-fold-speed reproduction, two halves of waveform sections P1 and P2 and waveform section P4 contiguous to section P2 are reproduced to replace them with two waveform sections. By alternately reproducing the waveform subjected to the above addition-average processing and that not subjected thereto, reproduction can be performed at a speed 1.5 times the normal speed. If the number (n) of waveforms not subjected to the addition-average processing is adjusted, high-speed reproduction can be performed at a speed lower than 1.5 times the normal speed. As indicated by the arrows in FIG. 14, the reproduction speed can be adjusted more finely by varying the inclinations of the above weight window functions.

It is desirable to determine whether the addition-average processing is executed in each frame of about 1 to 2 seconds. More specifically, the processing is not executed preferably with respect to waveform sections of silent signals or sections of consonants, but it is executed with respect to those of vowels which are easy to hear.

Figure 15:
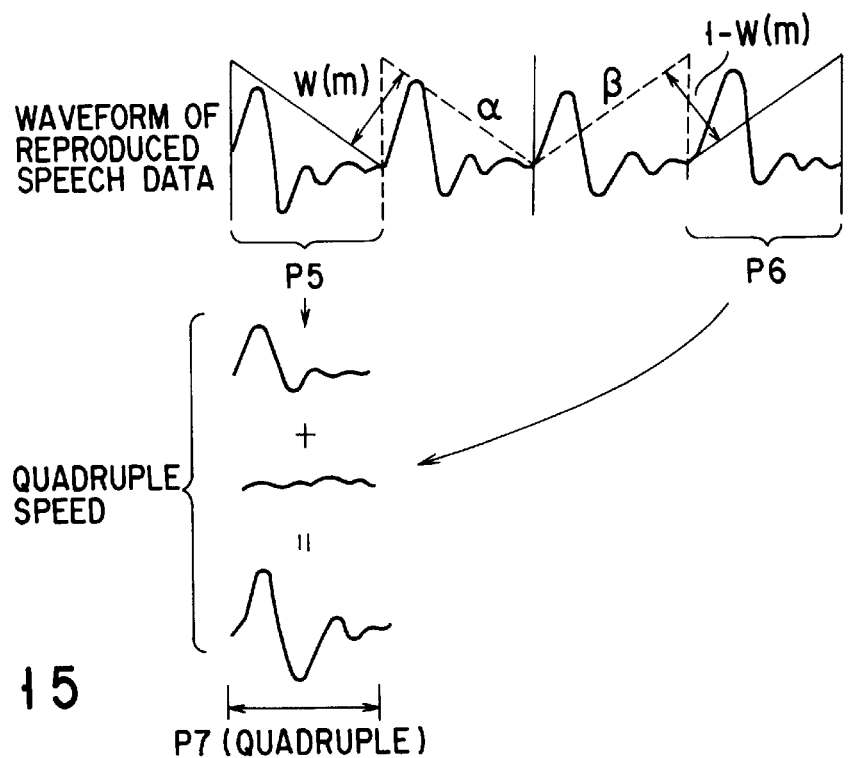
FIG. 15 is a waveform for explaining a time-axially compressing operation performed in the reproduction at a speed 2 to 4 times the normal speed, as shown in the flowchart of FIG. 13.

The decoding section 18B of the DSP 18 executes the following processing in response to the instruction of the step S704. For example, in quadruple-speed reproduction, as shown in FIG. 15, a weight window function [W(m)] is applied to section P5 of a waveform of reproduction speech data sent from the CPU 20, and its opposite weight window function [1-W(m)] is applied to section P6 thereof. Two waveforms α and β between the sections P5 and P6 are removed and the waveforms of sections P5 and P6 are added to each other, thereby time-axially compressing the waveforms of four cycles to that of one cycle. The reproduction speed lower than the quadruple speed can be attained by adding n waveforms after the section P6, as in the above case. As indicated by the arrows in FIG. 15, the reproduction speed can be adjusted more finely by varying the inclinations of the above weight window functions.

If the signals of the waveforms α and β to be removed are silent, it is desirable to exchange them for the n waveforms. It is also desirable to remove signals which are almost silent or low in level. Even when the waveforms are exchanged, it is determined whether they are removed or not for each frame of 1 to 2 seconds.

The processing of step S705, which is executed at speeds exceeding the speed four times the normal speed, will now be described, with reference to the flowchart shown in FIG. 16.

This processing is FF or REW reproduction performed at speeds 6 to 10 times the normal speed. First it is determined whether the number n of frames counted by an internal counter reaches 100 (step S801). If the number does not reach it, the flow returns to the original routine. When the number is 100 or more, it is determined at what time speed the reproduction is performed by data output from the A/D converter 44B or operation pressure sensed by the sensor 44A (step S802). If the data of the A/D converter 44B indicates a sixfold speed, the operating position jumps to an address of 600 frames ahead (step S803). Similarly, if the data indicates an eightfold speed, the position jumps to an address of 800 frames ahead (step S804). In the case of a tenfold speed, the position jumps to an address of 1000 frames ahead (step S805). Completing these high-speed operations, the number n of frames is reset to "0" (step S806), and the flow returns to the original routine.

More specifically, after reproduction is executed for two seconds (100 frames), the reproduction operating position is moved instantaneously to the address of 12 seconds after (600 frames ahead) in the case of sixfold speed, that of 16 seconds after (800 frames ahead) in the case of eightfold speed, and that of 20 seconds after (1000 frames ahead) in the case of tenfold speed. After reproduction of two seconds, the same operation is continued until the output voltage of the sensor 44A falls within each of the ranges a to c (FF skip reproduction).

As described above, the speed of high-speed (fast) reproduction can be adjusted by the operation pressure of slide button 42A of stepless operation member 42.

According to the foregoing second embodiment, the stepless operation member 42 is provided with the slide button 42A. However, as shown in FIG. 17A, a push button 42E can be employed in place of the slide button 42A. FIG. 17B shows a constitution of a detection circuit 44 for detecting such a pressure button type member. As shown in FIG. 17B, an output signal of a pressure sensor 44C for detecting a pressure of the member 42 is transmitted to an A/D converter 44E through an LPF 44D and converted into a digital signal, and the signal is supplied to the CPU 20. Since, in this sensor 44C, the amplitude of an oscillation signal of an oscillator 42F varies according to the pressure of the push button 42, the CPU 20 detects variations in the pressure of button 42E in accordance with the varying amplitude. This stepless operation member 42 can be constituted that the push button 42E is provided above one electrode 42G of a piezoelectric element of PZT (lead zirconate titanate), serving as the oscillator 42F, with a spring 42H interposed between the electrode 42G and button 42E. In this constitution, if the push button 42E is depressed, its pressure is transmitted to the piezoelectric element via the spring 42H, and the amplitude of the oscillation signal is decreased in response to the pressure of the push button 42E.

In most cases, the contents of speech data to be recorded are messages of letters and the like. If, therefore, the operations of returning an operating position to an arbitrary recording part, inserting and/or correcting a message, and then returning the position to the final recording position can easily be performed during the recording in order to correct the contents that an operator spoke by mistake or forgot to say, the recording of the message can be quickly continued and, in this case, the apparatus of this embodiment is very convenient.

To perform the above-described operations without any errors, a digital recorder according to a third embodiment of the present invention, will now be described.

Figure 18:
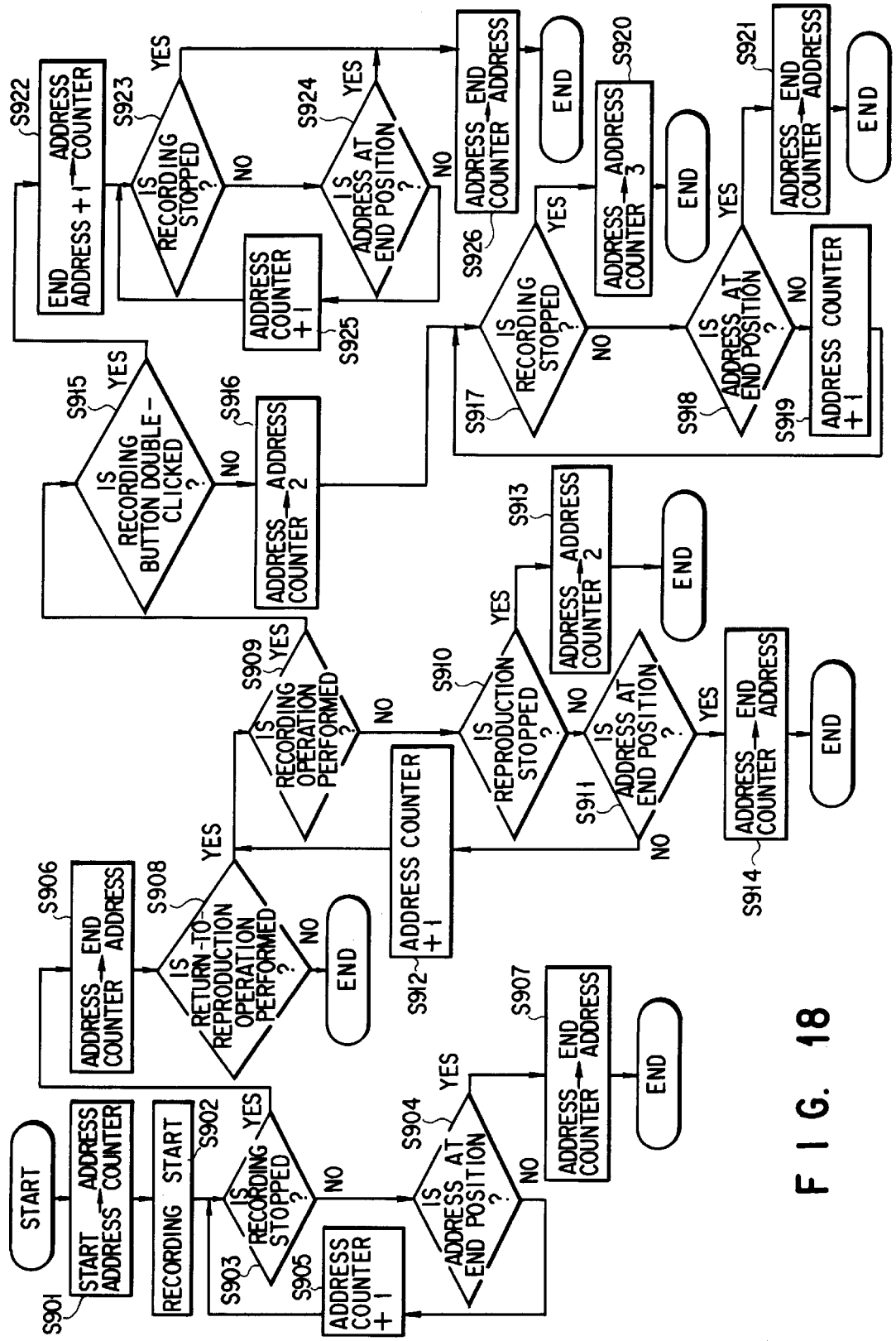
FIG. 18 is a flowchart for explaining an operation of a solid memory recording/reproduction apparatus according to a third embodiment of the speech information recording/reproduction apparatus of the present invention.

The basic constitution and operation of the digital recorder of the third embodiment are the same as those of the recorder of the first embodiment; however, the operating functions as shown in the flowchart of FIG. 18 are added thereto.

After power is on or a stop operation is finished, the CPU 20 sets a start address in an internal address counter based on the use of a solid memory 22 (step S901). Then a recording switch 28J is operated to start a recording operation (step S902 corresponding to the above steps S301 to S306).

It is determined whether a user stops the recording operation by operating a stop switch 28K (step S903 corresponding to the above step S310). If NO in step S903, it is determined whether the address of the address counter reaches the end position of the solid memory 22 (step S904 corresponding to the above step S307). If NO in step S904, the count value of the address counter is increased by one (step S905), and the flow returns to the step S903. While the count values are increased one by one, the recording operation is repeated until a recording stop operation is performed or an address reaches the end of the memory 22.

Figure 19A:
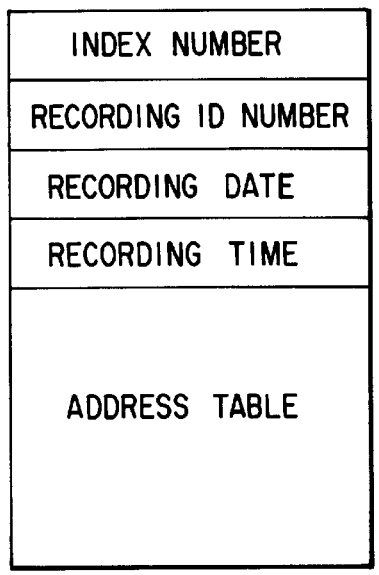
FIGS. 19A and 19B are views showing index data and an arrangement of address table.

If a recording stop operation is carried out in the step S903, the recording operation is stopped, and then a count value of the address counter is written as an end address to an address table of index shown in FIG. 19A (step S906). When the address reaches the end of the solid memory in step S904, the value of the address counter is also written as an end address to the address table shown in FIG. 19A, and the recording operation is completed (step S907 corresponding to the above step S303).

After the recording stop operation, it is determined whether a user performs a return-to-reproduction operation (step S908). If No in step S908, the operation ends.

If YES in step S908, the return-to-reproduction operation is executed. In the operation, a reproduction operation can be performed after the current position automatically returns to the start address, i.e., the recording start position, or a user can return the current position to an arbitrary one to start reproduction. In this embodiment, the reproduction is started after the current position is returned to the recording start position and, in this case, speech data indicated by the start address is read out from the solid memory 22 and output for the reproduction.

It is then determined whether the user performs a recording operation (step S909). If NO in step S909, the user operates the stop switch 28K to judge whether a reproduction stop operation is carried out (step S910). If NO in step S910, it is determined whether an address of the address counter reaches the end of the memory (step S911). If NO in step S911, the count value of the address counter is increased by one (step S912), and the flow returns to the step S909. While the count values of the address counter are increased one by one, the reproduction operation is repeated until a reproduction stop operation is performed or an address reaches the end of the memory 22.

If a reproduction stop operation is performed in step S910, the value (address 2) of the address counter is held to stop the reproduction and stand by until the next operation is performed (step S913). When the address reaches the end of the memory in step S911, the count value of the address counter is written as an end address to the address table shown in FIG. 19A (step S914).

If it is determined in step S909 that the user carries out a recording operation during the return-to-reproduction, it is determined whether a recording switch 28J is depressed two or more times within a predetermined period of time (e.g., one second) (hereinafter referred to as a double click) (step S915). If NO in step S915, in other words, if the recording switch 28J is depressed only once, the value of the address counter (address 2) is written to the address table, and then, for example, insert recording is started (step S916 corresponding to the above steps S301 to S306).

It is then determined whether the user performs a recording stop operation by depressing the stop switch 28K during the insert recording (step S917 corresponding to the above step S310). If NO in step S917, it is determined whether the count value of the address counter reaches the end of the memory (step S918 corresponding to the above step S307). If NO in step S918, the count value is increased by one (step S919), and the flow returns to the step S917.

When the recording stop operation is carried out in step S917, the value (address 3) of the address counter is written to the address table shown in FIG. 19A to stop the recording operation (step S920). When the address reaches the end of the memory in step S918, the value of the address counter is written as an end address to the address table, and the recording operation is completed. (step S921 corresponding to the above step S303).

If the recording switch 28J is double-clicked in step S915, a value of the end address plus 1 is set in the address counter (step S922). Additional recording can thus be started from the final recording position.

It is then determined whether a recording stop operation is performed by depressing the stop switch 28K during the recording (step S923). If NO in step S923, it is determined whether the address of the address counter reaches the end of the memory (step S924). If NO in step S924, the value of the address counter is increased by one (step S925), and the flow returns to step S923. While the count values of the address counter are increased one by one, recording is repeated until a reproduction stop operation is performed or an address reaches the end of the memory 22.

If the recording stop operation is performed in step S923, the recording is stopped, and the value of the address counter is written as an end address to the address table, and the recording is completed (step S926).

Figure 19B:
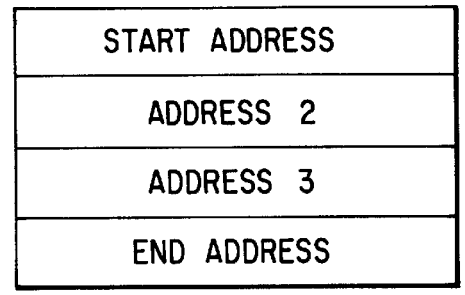

The address table of index shown in FIG. 19A includes the contents shown in FIG. 19B. By referring to these contents in order, the reproduction is executed.

Figure 20:
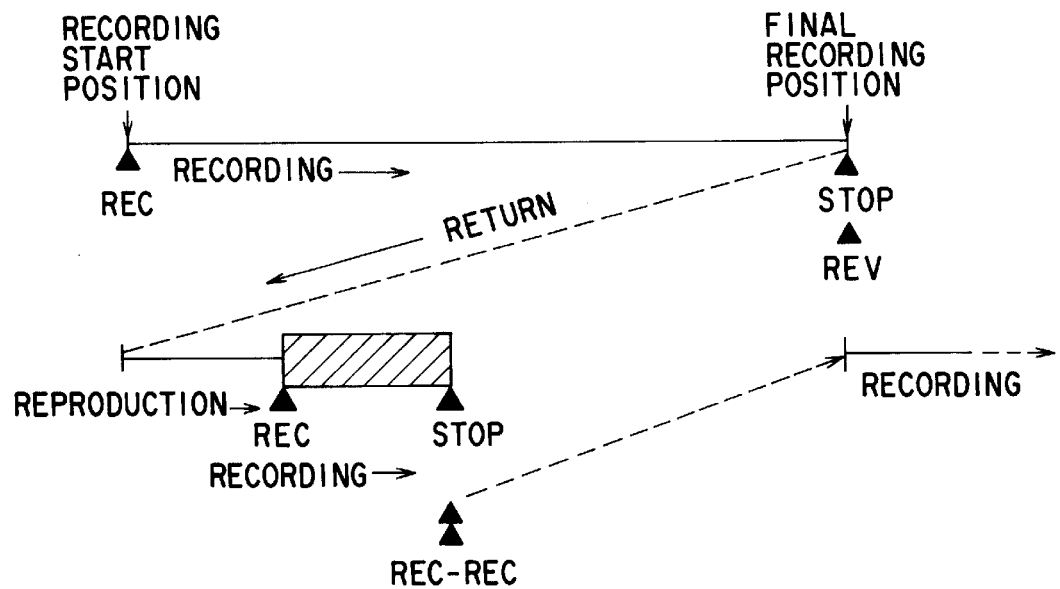
FIG. 20 is a view for explaining an operation of the apparatus according to the third embodiment of the present invention.

The above-described operations of the CPU 20 are summarized as follows with reference to FIG. 20. First a user starts recording by operating the recording switch 28J and then stops it by operating the stop switch 28K. The recording is also stopped when an address reaches the end of the memory. It is then determined whether the user depresses the REW switch 28N or a special REW-to-reproduction (REV) switch. If YES, the current position is returned to the recording start position (start address) to start the reproduction therefrom. If the user depresses the recording switch 28J only once during the reproduction, for example, the insert recording is started and continued until the stop switch 28K is depressed or the address reaches the final position.

On the other hand, if the user double-clicks (REC-REC) the recording switch 28J, the position jumps to the final recording position at once, and the additional recording is started therefrom.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A speech information recording/reproduction apparatus comprising:

a rewritable solid memory for recording digital speech data, into which a speech signal is converted;

erasing means for erasing the speech data from the solid memory;

a first operation section for setting an erase range to erase the speech data from the solid memory, said first operation section including a position search operation member and a partial erasure operation member, said position search operation member being operated to search for an erasure start position, said partial erasure operation member being operated to indicate a partial erasure of the speech data, said position search operation member being operated again to search for an erasure end position, and said partial erasure operation member being operated again to set the erase range;

delay means for delaying erasing of the speech data by a predetermined period of time after the erase range is set by said first operation section;

a display for displaying predetermined information on erasure for the predetermined period of time;

a second operation section for canceling the erasure; and a controller for preventing said erasing means from erasing the speech data when said second operation section is operated while said display is displaying the predetermined information, and for causing said erasing means to erase the speech data from said solid memory when said second operation section is not operated while said display is displaying the predetermined information.

2. The apparatus according to claim 1, wherein said solid memory records the speech data on a file by file basis, and said controller prevents said erasing means from erasing the speech data in a given file when a flag for inhibiting erasure is set with respect to the given file.

3. The apparatus according to claim 2, further comprising a signalling device for informing an operator that the flag for inhibiting erasure is set with respect to the given file.

4. The apparatus according to claim 1, wherein, while said first operation section is setting the erase range of the speech data recorded in the solid memory, said display displays information other than information which is displayed for the predetermined period of time after the erase range is set.

5. The apparatus according to claim 1, wherein said display displays the predetermined information on erasure by a combination of lighting and letters.

6. The apparatus according to claim 1, further comprising:

a reproduction unit for reproducing the speech data from the solid memory;

an operation member for indicating a reproduction speed of the speech data; and a detector for detecting an amount of operation of said operation member, and wherein said controller causes said reproduction unit to:
(i) reproduce the speech data by time-axially compressing the speech signal such that a content of the speech data can be recognized, when the reproduction speed indicated by said operation member ranges from a normal reproduction speed to a predetermined high-speed reproduction speed, and (ii) reproduce the speech data such that it can be determined whether or not the speech data represents a speech signal, when the reproduction speed exceeds the predetermined high-speed reproduction speed.

7. The speech information recording/reproduction apparatus according to claim 1, further comprising:
   a recording unit for recording the speech data in the solid memory;
   an instruction section for instructing said recording unit to start recording the speech data in said solid memory on a file by file basis;
   a flag setting member for setting a protect flag for inhibiting the speech data from being erased for each file; and
   a mode setting section for setting an overwrite mode for recording speech data while erasing the speech data recorded in the solid memory; and
   wherein when the overwrite mode is set by said mode setting section, said controller: (i) causes an alarm to be sounded and inhibits speech data from being recorded by said recording unit when said instruction section instructs said recording unit to start recording from a part of a file in which the protect flag is set, and (ii) causes said recording unit to record the speech data when said instruction section instructs said recording unit to start recording from a bottom of the file in which the protect flag is set.

8. A speech information recording/reproduction apparatus according to claim 1, wherein said position search operation member comprises a reproduction mode setting member.

9. A speech information recording/reproduction apparatus comprising:
   a rewritable solid memory for recording digital speech data, into which a speech signal is converted;
   erasing means for erasing the speech data from the solid memory;
   a first operation section for setting an erase range to erase the speech data from the solid memory;
   delay means for delaying erasing of the speech data by a predetermined period of time after the erase range is set by said first operation section;
   a display for displaying predetermined information on erasure for the predetermined period of time;
   a second operation section for canceling the erasure;
   a controller for preventing said erasing means from erasing the speech data when said second operation section is operated while said display is displaying the predetermined information, and for causing said erasing means to erase the speech data from said solid memory when said second operation section is not operated while said display is displaying the predetermined information; and
   a recording mode setting operation member which is operable to set a recording mode,
   wherein, in one of a reproduction operation state and a reproduction standby state, said controller: (i) initiates a recording operation from a given address when said recording mode setting operation member is operated once within a given period of time, and (ii) initiates a recording operation from a final recording address when said recording mode operation member is operated at least two times within the given period of time.

10. A speech information recording/reproduction apparatus comprising:
    a rewritable solid memory for recording digital speech data, into which a speech signal is converted, on a file by file basis;
    erasing means for erasing the speech data from the solid memory;
    a first operation section for setting erase information with respect to each file of the speech data in the solid memory;
    first delay means for delaying erasing of the speech data by a first predetermined period of time after the erase information is set by said first operation section;
    a first display for displaying first predetermined information on erasure for the first predetermined period of time;
    a second operation section for canceling the erasure;
    a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;
    second delay means for, when the operation of said first operation section is not released within the first predetermined period of time, delaying erasing the speech data by a second period of time;
    a second display for displaying second predetermined information on erasure for a second predetermined period of time; and
    a second controller for preventing said erasing means from erasing the speech data when said second operation switch is operated while said second display is displaying the second predetermined information, and for causing said erasing means to erase all files from said solid memory.

11. The apparatus according to claim 10, wherein said first controller prevents said erasing means from erasing the speech data in a given file when a flag for inhibiting erasure is set with respect to the given file.

12. The apparatus according to claim 10, wherein said second controller causes said erasing means to erase files to be erased in accordance with the erase information set by said first operation section and files except at least one file with respect to which a flag for inhibiting erasure is set.

13. A speech information recording/reproduction apparatus comprising:
    a rewritable solid memory for recording digital speech data, into which a speech signal is converted;
    erasing means for erasing the speech data from the solid memory;
    a first operation section for setting an erase range to erase the speech data from the solid memory;
    delay means for delaying erasing of the speech data by a predetermined period of time after the erase range is set by said first operation section;
    a display for displaying predetermined information on erasure for the Predetermined period of time;
    a second operation section for canceling the erasure; and
    a controller for preventing said erasing means from erasing the speech data when said second operation section is operated while said display is displaying the predetermined information, and for causing said erasing means to erase the speech data from said solid memory when said second operation section is not operated while said display is displaying the predetermined information;

wherein said solid memory records said digital speech data on a file by file basis, and records index data including a recording date and time when the speech data of each file is recorded;

wherein a reproduction unit is provided for reproducing the speech data from said solid memory; and wherein said display displays the recording date and time of a given file for a predetermined period of time when a head of the given file is reproduced by said reproduction unit.

14. The apparatus according to claim 13, wherein said index data includes a date and time when recording of a given file finally ends, and said display displays the date and time when the recording of the given file finally ends.

15. The apparatus according to claim 13, wherein said index data includes a date and time when recording of a given file first starts, and said display displays the date and time when the recording of the given file first starts.

16. The speech information recording/reproduction apparatus according to claim 1, further comprising:

a recording unit for recording the speech data in the solid memory;

a reproduction unit for reproducing the speech data from the solid memory; and a hold-mode setting operation member which is operable to set a hold mode;

wherein said display displays a plurality of different information items in accordance with a plurality of operation modes and operation states thereof; and wherein when said hold-mode setting operation member is turned on, said controller cuts off power supplied to respective components including at least one of said recording unit and said reproduction unit, causes said display to serve as a clock, and prevents signals from being input from the operation members other than the hold-mode setting operation member;

wherein when the hold-mode setting operation member is turned on while one of a recording mode and a reproduction mode is being executed, said controller causes one of the recording mode and the reproduction mode to be continued, prevents signals from being input by the operation members other than said hold-mode setting operation member, cuts off power supplied to the respective components including at least one of said recording unit and said reproduction unit, immediately after the mode is finished, and causes said display to serve as a clock; and wherein when said hold-mode setting operation member is turned off while the apparatus is stopped, said controller supplies power to the respective components including at least one of said recording unit and said reproduction unit, and causes said display to display predetermined information and, when no signals are input from said plurality of operation members for a predetermined time, turns off the power supplied to the respective components including at least one of said recording unit and said reproducing unit, and causes said display to serve as a clock.

17. A speech information recording/reproduction apparatus comprising:

a rewritable solid memory for recording digital speech data, into which a speech signal is converted, on a file by file basis;

an erase range setting section for setting an arbitrary range of speech data to be erased; and erasing means for, when a plurality of consecutive files are included in the arbitrary range set by said erase range setting section, erasing the speech data from each of the files in the arbitrary range.

18. A speech information recording/reproduction apparatus according to claim 17, wherein said erasing means includes means for erasing files completely included in the arbitrary range together with the speech data.

19. A speech information recording/reproduction apparatus comprising:

a rewritable solid memory for recording digital speech data, into which a speech signal is converted, on a file by file basis;

erasing means for erasing the speech data from the solid memory;

a first operation section for setting erase information with respect to each file of the speech data in the solid memory;

first delay means for delaying erasing of the speech data by a first predetermined period of time after the erase information is set by said first operation section;

a first display for displaying first predetermined information on erasure for the first predetermined period of time;

a second operation section for canceling the erasure;

a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;

second delay means for, when the operation of said first operation section is not released within the first predetermined period of time, delaying erasing the speech data by a second period of time;

a second display for displaying second predetermined information on erasure for a second predetermined period of time; and a second controller for preventing said erasing means from erasing the speech data when said second operation switch is operated while said second display is displaying the second predetermined information, and for causing said erasing means to erase all files from said solid memory;

wherein said first and second displays display the first and second predetermined information on erasure by a combination of lighting and letters.

20. A speech information recording/reproduction apparatus comprising:

a rewritable solid memory for recording digital speech data, into which a speech signal is converted, on a file by file basis;

erasing means for erasing the speech data from the solid memory;

a first operation section for setting erase information with respect to each file of the speech data in the solid memory;

first delay means for delaying erasing of the speech data by a first predetermined period of time after the erase information is set by said first operation section;

a first display for displaying first predetermined information on erasure for the first predetermined period of time;

a second operation section for canceling the erasure;

a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;

second delay means for, when the operation of said first operation section is not released within the first predetermined period of time, delaying erasing the speech data by a second period of time;

a second display for displaying second predetermined information on erasure for a second predetermined period of time;

a second controller for preventing said erasing means from erasing the speech data when said second operation switch is operated while said second display is displaying the second predetermined information, and for causing said erasing means to erase all files from said solid memory;

a reproduction unit for reproducing the speech data from the solid memory;

an operation member for indicating a reproduction speed of the speech data;

a detector for detecting an amount of operation of said operation member; and a controller for causing said reproduction unit to: (i) reproduce the speech data by time-axially compressing the speech signal such that a content of the speech data can be recognized, when the reproduction speed indicated by said operation member ranges from a normal reproduction speed to a predetermined high-speed reproduction speed, and (ii) reproduce the speech data such that it can be determined whether or not the speech data represents a speech signal, when the reproduction speed exceeds the predetermined high-speed reproduction speed.

21. A speech information recording/reproduction apparatus comprising:

a rewritable solid memory for recording digital speech data, into which a speech signal is converted, on a file by file basis;

erasing means for erasing the speech data from the solid memory;

a first operation section for setting erase information with respect to each file of the speech data in the solid memory;

first delay means for delaying erasing of the speech data by a first predetermined period of time after the erase information is set by said first operation section;

a first display for displaying first predetermined information on erasure for the first predetermined period of time;

a second operation section for canceling the erasure;

a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;

second delay means for, when the operation of said first operation section is not released within the first predetermined period of time, delaying erasing the speech data by a second period of time;

a second display for displaying second predetermined information on erasure for a second predetermined period of time;

a second controller for preventing said erasing means from erasing the speech data when said second operation switch is operated while said second display is displaying the second predetermined information, and for causing said erasing means to erase all files from said solid memory;

a recording unit for recording the speech data in the solid memory;

a reproduction unit for reproducing the speech data from the solid memory; and a hold-mode setting operation member which is operable to set a hold mode; and a controller for controlling operation of the speech information recording/reproduction apparatus in a plurality of different operation modes;

wherein when said hold-mode setting operation member is turned on, said controller cuts off power supplied to respective components including at least one of said recording unit and said reproduction unit, causes said display to serve as a clock, and prevents signals from being input from the operation members other than the hold-mode setting operation member;

wherein when the hold-mode setting operation member is turned on while one of a recording mode and a reproduction mode is being executed, said controller causes one of the recording mode and the reproduction mode to be continued, prevents signals from being input by the operation members other than said hold-mode setting operation member, cuts off power supplied to the respective components including at least one of said recording unit and said reproduction unit, immediately after the mode is finished, and causes said display to serve as a clock; and wherein when said hold-mode setting operation member is turned off while the apparatus is stopped, said controller supplies power to the respective components including at least one of said recording unit and said reproduction unit, and causes said display to display predetermined information and, when no signals are input from said plurality of operation members for a predetermined time, turns off the power supplied to the respective components including at least one of said recording unit and said reproducing unit, and causes said display to serve as a clock.

22. A speech information recording/reproduction apparatus comprising:

a rewritable solid memory for recording digital speech data, into which a speech signal is converted, on a file by file basis;

erasing means for erasing the speech data from the solid memory;

a first operation section for setting erase information with respect to each file of the speech data in the solid memory;

first delay means for delaying erasing of the speech data by a first predetermined period of time after the erase information is set by said first operation section;

a first display for displaying first predetermined information on erasure for the first predetermined period of time;

a second operation section for canceling the erasure;

a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;

second delay means for, when the operation of said first operation section is not released within the first predetermined period of time, delaying erasing the speech data by a second period of time;

a second display for displaying second predetermined information on erasure for a second predetermined period of time;

a second controller for preventing said erasing means from erasing the speech data when said second operation switch is operated while said second display is displaying the second predetermined information, and for causing said erasing means to erase all files from said solid memory;

a recording unit for recording the speech data in the solid memory;

an instruction section for instructing said recording unit to start recording the speech data in said solid memory on a file by file basis;

a flag setting member for setting a protect flag for inhibiting the speech data from being erased for each file;

a mode setting section for setting an overwrite mode for recording speech data while erasing the speech data recorded in the solid memory; and a controller for, when the overwrite mode is set by said mode setting, (i) causing an alarm to be sounded and inhibiting speech data from being recorded by said recording unit when said instruction section instructs said recording unit to start recording from a part of a file in which the protect flag is set, and (ii) causing said recording unit to record the speech data when said instruction section instructs said recording unit to start recording from a bottom of the file in which the protect flag is set.

23. A speech information recording/reproduction apparatus comprising:

a rewritable solid memory for recording digital speech data, into which a speech signal is converted, on a file by file basis;

erasing means for erasing the speech data from the solid memory;

a first operation section for setting erase information with respect to each file of the speech data in the solid memory;

first delay means for delaying erasing of the speech data by a first predetermined period of time after the erase information is set by said first operation section;

a first display for displaying first predetermined information on erasure for the first predetermined period of time;

a second operation section for canceling the erasure;

a first controller for, if an operation of said first operation section is released within the first predetermined period of time, preventing said erasing means from erasing the speech data when said second operation section is operated while said first display is displaying the first predetermined information, and for causing said erasing means to erase the speech data from said solid memory for each file when said second operation section is not operated while said first display is displaying the first predetermined information;

second delay means for, when the operation of said first operation section is not released within the first predetermined period of time, delaying erasing the speech data by a second period of time;

a second display for displaying second predetermined information on erasure for a second predetermined period of time;

a second controller for preventing said erasing means from erasing the speech data when said second operation switch is operated while said second display is displaying the second predetermined information, and for causing said erasing means to erase all files from said solid memory;

wherein said solid memory records the speech data on a file by file basis, and a controller prevents said erasing means from erasing the speech data in a given file when a flag for inhibiting erasure is set with respect to the given file; and wherein a signalling device is provided for informing an operator that the flag for inhibiting erasure is set with respect to the given file.

* * * * *